United States Patent [19]
Saitoh et al.

[11] Patent Number: 5,550,635
[45] Date of Patent: Aug. 27, 1996

[54] ROTATIONAL DEVIATION DETECTING METHOD AND SYSTEM USING A PERIODIC PATTERN

[75] Inventors: Kenji Saitoh, Atsugi; Koichi Sentoku, Kanagawa-ken; Takahiro Matsumoto, Zama, all of Japan

[73] Assignee: Canon Kabushiki Kaisha, Tokyo, Japan

[21] Appl. No.: 330,736

[22] Filed: Oct. 28, 1994

[30] Foreign Application Priority Data

Oct. 29, 1993 [JP] Japan .................. 5-293910
Oct. 18, 1994 [JP] Japan .................. 6-252172

[51] Int. Cl.$^6$ .............. G01B 11/00; G01B 9/02
[52] U.S. Cl. .............. 356/401; 356/356; 356/363; 250/548
[58] Field of Search .............. 356/150, 152.1, 356/154, 356, 363, 375, 401; 250/237 G, 548

[56] References Cited

U.S. PATENT DOCUMENTS

| | | | |
|---|---|---|---|
| 4,433,585 | 2/1984 | Levine | 73/862.34 |
| 4,804,270 | 2/1989 | Miller et al. | 356/355 |
| 5,196,711 | 3/1993 | Matsugu et al. | 250/548 |
| 5,285,259 | 2/1994 | Saitoh | 356/401 |
| 5,313,272 | 5/1994 | Nose et al. | 356/375 |
| 5,333,050 | 7/1994 | Nose et al. | 356/356 |
| 5,347,356 | 9/1994 | Ota et al. | 356/363 |
| 5,369,486 | 11/1994 | Matsumoto et al. | 356/349 |

FOREIGN PATENT DOCUMENTS

| | | |
|---|---|---|
| 0449582 | 10/1991 | European Pat. Off. . |
| 0534758 | 3/1993 | European Pat. Off. . |
| 60-77273 | 5/1985 | Japan . |
| 61-66926 | 4/1986 | Japan . |
| 03272406 | 12/1991 | Japan . |
| 04212002 | 8/1992 | Japan . |

*Primary Examiner*—F. L. Evans
*Assistant Examiner*—Robert Kim
*Attorney, Agent, or Firm*—Fitzpatrick, Cella, Harper & Scinto

[57] ABSTRACT

A deviation detecting system for detecting a rotational deviation of an object, includes a pattern formed on the object and having a periodicity, a light source for providing light, a detecting device for projecting the light from the light source onto the pattern and for detecting at least two diffraction lights from the pattern with a predetermined detection plane, and a determining device for determining a rotational deviation of the object with respect to a predetermined axis, on the basis of the positions of incidence of the diffraction lights upon the detection plane as detected through the detection by the detecting device.

27 Claims, 24 Drawing Sheets

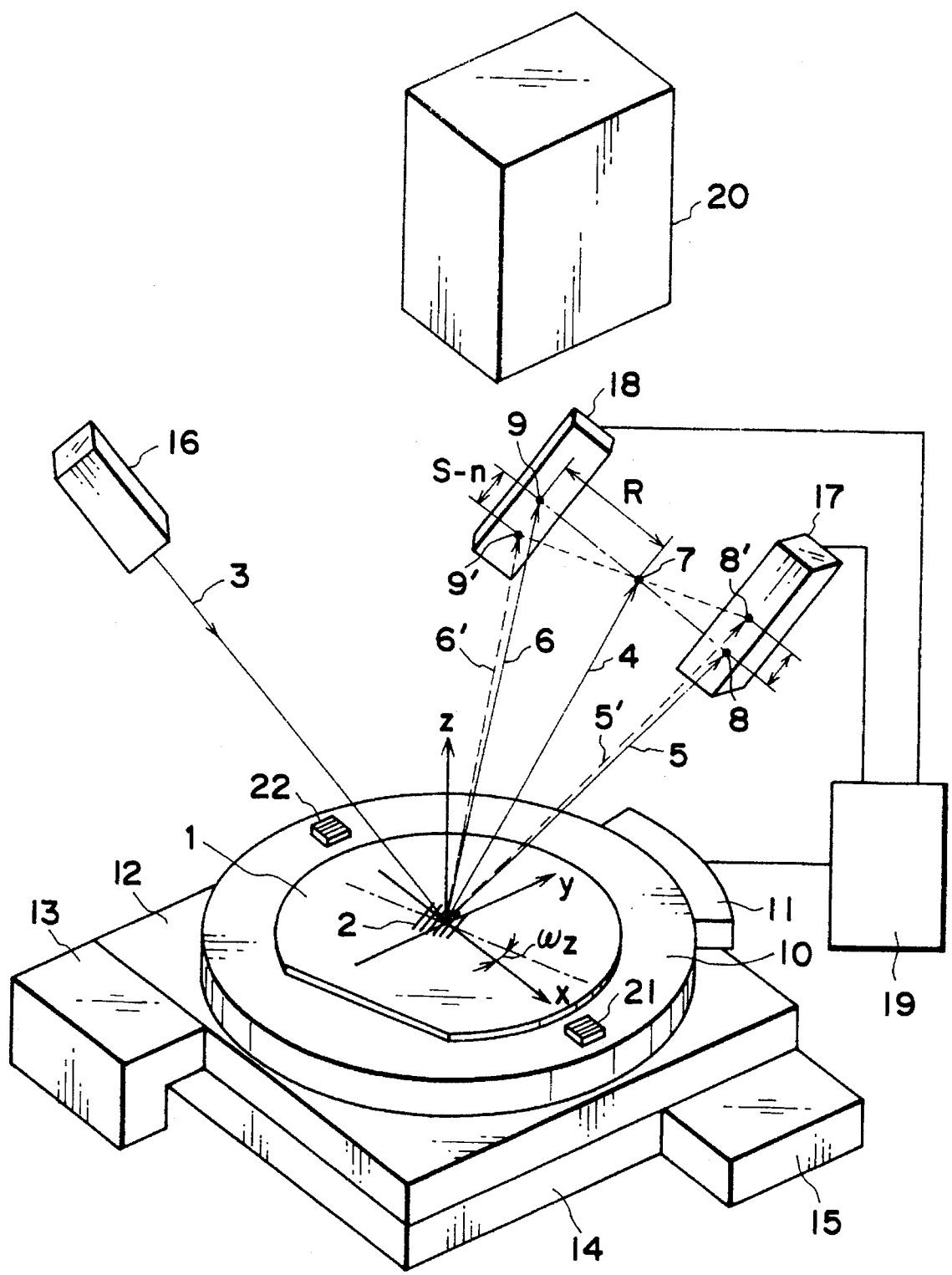
F I G. 15

ROTATIONAL DEVIATION DETECTING METHOD AND SYSTEM USING A PERIODIC PATTERN

FIELD OF THE INVENTION AND RELATED ART

This invention relates to a positional deviation detecting method and a positional deviation detecting system using the same. More particularly, the invention is concerned with a rotational deviation detecting method and system suitably usable, for example, in a microscope sample table for detecting a rotational deviation of a sample to be inspected, an electron beam drawing apparatus for hologram setting, an exposure apparatus, a registration evaluating apparatus, a rotary encoder or a yawing detecting device, wherein diffraction light from a diffraction grating provided on an article to be examined is used to detect a rotational deviation of the article.

In another aspect, the invention is concerned with a positional deviation detecting method and a positional deviation detecting system using the same, suitably usable in a semiconductor device manufacturing exposure apparatus, for measuring registration precision (i.e. positional deviation) of a printed pattern (such as fine electronic circuit pattern) of a mask or reticle (first object), being printed on a wafer (second object) through lithographic exposure.

Many proposals have been made on such a structure wherein an article to be examined is placed on a sample table of a microscope, and wherein a rotational deviation of the sample table with respect to the direction of advancement for successive observation of small regions of the article is detected for correction of the position of the table. In these conventional structures, generally the correction of rotational deviation is done on the basis of observation of patterns provided at opposite ends with respect to the advancement direction of the article.

Japanese Laid-Open Patent Application, Laid-Open No. 77273/1985 discloses a system for detecting a rotational deviation of an article on the basis of image processing to a predetermined pattern. Japanese Laid-Open Patent Application, Laid-Open No. 66926/1986 discloses a rotary encoder for detecting a rotational deviation of an article at high precision.

There is a first example of known methods for measuring a positional deviation of an article to be examined, wherein patterns are printed on the article and wherein mutual deviation of the patterns is measured by using a pattern linewidth measuring device.

There is a second example of known methods (vernier type) wherein gratings of different pitches are printed upon an integrated circuit pattern and wherein the overlapped portions of the gratings are read out. A third known method is that elongating resisters and electrodes are formed superposedly on an integrated circuit, and resistances of them are compared with each other.

A fourth known method is disclosed in Japanese Laid-Open Patent Application, Laid-Open No. 212002/1992, filed in the name of the assignee of the subject application, wherein diffraction gratings are printed on an integrated circuit, and deviation of patterns is measured on the basis of a phase difference of diffraction lights.

The fourth method will be explained below in detail.

FIG. 1 is a schematic view for explaining the principle of detection of a positional deviation detecting system proposed in aforementioned Japanese Laid-Open Patent Application, Laid-Open No. 212002/1992.

In FIG. 1, two adjacent straight gratings A' and B' of the same spacing are formed on the same plane, i.e., the surface of an object. Here, each of the two gratings has the same pitch P', and there is a deviation ($\Delta X = X_B' - X_A'$) in the direction of the arrows (X direction) between these gratings.

One of the gratings is denoted by A' and the other is denoted by B', wherein $X_A'$ and $X_B'$ are deviations in the X direction of the gratings A' and B', respectively, from the same reference position.

It is assumed that two lights 109 and 110 having slightly different frequencies $w_{f1}$ and $w_{f2}$, respectively, and having initial phases $\phi_{of1}$ and $\phi_{of2}'$, respectively, are projected on the gratings A' and B'. Here, the complex amplitudes $E_{f1}$ and $E_{f2}$ of the two lights 109 and 110 are expressed as follows:

$$E_{f1} = A_0 \exp\{i(w_{f1}t + \phi_{of1})\} \tag{1}$$

$$E_{f2} = B_0 \exp\{i(w_{f2}t + \phi_{of2})\} \tag{2}$$

The two lights 109 and 110 as such are projected on the whole surfaces of the two gratings.

For example, the light 109 is projected from the left while the light 110 is projected from the right, both at the same incidence angle (same absolute value). Here, positive first order lights from the gratings A' and B7 resulting from the light 109 are denoted by 111 and 112, respectively, while negative first order diffraction lights from the gratings A' and B' resulting from the light 110 are denoted by 113 and 114, respectively.

Taking the complex amplitudes of the lights 111, 113, 112 and 114 as $E'_{AF1}(+1)$, $E'_{AF2}(-1)$, $E'_{Bf1}(+1)$ and $E'_{Bf2}(-1)$, they can be expressed as follows:

$$E'_{AF1}(+1) = A_{f1} \exp\{i(w_{f1}t + \phi_{of1} + \phi_A')\} \tag{3}$$

$$E'_{AF2}(-1) = A_{f2} \exp\{i(w_{f2}t + \phi_{of2} + \phi_A')\} \tag{4}$$

$$E'_{Bf1}(+1) = B_{f1} \exp\{i(w_{f1}t + \phi_{of1} + \phi_B')\} \tag{5}$$

$$E'_{Bf2}(-1) = B_{f2} \exp\{i(w_{f2}t + \phi_{of2} + \phi_B')\} \tag{6}$$

Here, $\phi_A' = 2\pi X_A'/P$ and $\phi_B' = 2\pi X_B'/P$, and they are the positional deviations of the gratings A' and B', respectively, with respect to the X direction, as represented in terms of phase quantity.

If the diffraction lights 111 and 113 from the grating A' interfere with each other and if the diffraction lights 112 and 114 from the grating B' interfere with each other, then there occur interference light intensity changes $I_A$ and $I_B$ expressed as follows:

$$\begin{aligned} I_A &= |E'_{Af1}(+1) + E'_{Af2}(-1)|^2 \\ &= A_{f1}^2 + A_{f2}^2 + 2A_{f1}A_{f2} \cdot \cos\{2\pi(f_2 - f_1)t + (\phi_{of2} - \phi_{of1}) - 2\phi_A'\} \end{aligned} \tag{7}$$

$$\begin{aligned} I_B &= |E'_{Bf1}(+1) + E'_{Bf2}(-1)|^2 \\ &= B_{f1}^2 + B_{f2}^2 + 2B_{f1}B_{f2} \cdot \cos\{2\pi(f_2 - f_1)t + (\phi_{of2} - \phi_{of1}) - 2\phi_B'\} \end{aligned} \tag{8}$$

where $f_1 = w_{f1}/2\pi$ and $f_2 = w_{f2}/2\pi$, while $A^2_{f1} + A^2_{f2}$ and $B^2_{f1} + B^2_{f2}$ are DC components and $2A_{f1}A_{f2}$ and $2B_{f1}B_{f2}$ are amplitudes. Equations (7) and (8) show that signals having a beat frequency component $f_2 - f_1$ have been phase-modulated with time by amounts corresponding to the initial phase difference $\phi_{o/2}-\phi_{o/1}$ as well as deviations $\phi_A'$ and $\phi_B'$ of the gratings A' and B', respectively.

Thus, by taking one of the signals represented by equations (7) and (8) as a reference signal while taking the other as a measured signal, and by detecting deviation of them with respect to time, the initial phase of the light can be deleted and high precision phase detection can be done (heterodyne interference measurement).

Since in the optical heterodyne interference method as described the phase difference between two signals can be detected in terms of time, the measurement is not affected by any difference in DC component of signals or by any change in amplitude of them.

If as depicted in FIG. 2 the difference in time between a reference signal 115 and a measured signal 116 is denoted by $\Delta T$, then high precision measurement of phase difference can be done by detecting $\Delta T$ precisely by using a lock-in amplifier, for example.

The thus detected phase difference corresponds to a phase difference $\Delta\phi$ representing the deviation $\Delta X$ between the gratings and, therefore, the mutual deviation $\Delta X$ of the gratings can be determined by $P' \times (\Delta\phi/4\pi)$.

Thus, by detecting a deviation $\Delta X$ between a grating pattern printed a first time and a grating pattern printed a second time in accordance with the principle described above, it is possible to detect the alignment precision of a semiconductor exposure apparatus, namely, a deviation (misregistration) between actual device patterns printed first and second times.

In some rotational deviation detecting devices of known types, patterns at opposite ends with respect to the advancement direction of an article to be examined are observed. This requires trial-and-error operations, being quite complicated. Also, the method based on image processing necessitates image processing computation with a complicated means. Thus, it is not very suited to high precision detection of a minute rotational deviation, particularly, in the point of processing time and precision.

The method using a rotary encoder requires that the axis of rotation is fixed beforehand. Thus, it is necessary to accomplish high precision alignment of the rotation axis, for attaining high precision measurement, and thus it needs complicated operations.

Further, in cases where the axis of rotation cannot be fixed generally such as a case wherein an evaluation sample is placed on a sample table or the measurement is to be done in connection with a mask θ alignment system of a semiconductor printing apparatus, this method cannot meet it sufficiently.

Further, according to the first method, of the methods for detecting positional deviation of an article to be examined, which method uses a pattern linewidth measuring apparatus, usually only a highest precision of about 0.01 micron will be attainable. With the second method (vernier type), at the best, only a precision of about 0.04 micron will be attainable.

With the third method based on resistance measurement, high precision is attainable but, on the other hand, complicated operation steps are necessary to carry out the measurement.

As compared, the fourth method meets the problems involved in the first and third methods, and it can be practiced with a relatively low cost. In the fourth method, however, there are cases where, with respect to the relationship between patterns (diffraction gratings) 53 and 54 to be measured and projected lights 109 and 110 onto these patterns, a problem to be described below arises in the point of a change in phase difference $\Delta\phi$ and the amount of rotation of a wafer 55 along its surface.

FIGS. 3 and 4 each illustrates the state in which light is projected on patterns (diffraction gratings) 53 and 54 to be examined. The distance between centers of the patterns 53 and 54 is denoted by d, and the central point of the pattern 53 is denoted by $P_1$ while the central point of the pattern 54 is denoted by $P_2$. The angle of incidence of the light upon the patterns 53 and 54 is deviated by $\theta_z$ as illustrated in FIG. 3.

Here, if the point of intersection between a ray of light 68 impinging on the point $P_2$ and a normal extending from the point $P_1$ to this ray is denoted by H and if the light 109 comprises plane wave light, then the positions H and $P_1$ are included in the same phase plane. The ray of light 2 impinging on the point $P_1$ is denoted by 67, and the ray of light 2 impinging on the point $P_2$ is denoted by 68. If the direction cosine of lights 67 and 68 in the advancement direction is denoted by $(\alpha, \beta, \gamma)$, then:

$$\overline{HP_2} = \beta \cdot d \qquad (9)$$

Also, the ray of light 110 impinging on the point $P_1$ is denoted by 70, and the ray of that light impinging on the point $P_2$ is denoted by 71. The complex amplitude representation of first order diffraction light of the light 67 is:

$$Ea'(f_1) = A \exp\{i(w_1 t + \phi_1 + \phi_a)\} \qquad (10)$$

Similarly, the complex amplitude representations of diffraction lights of the lights 70, 68 and 71 are:

$$Ea'(f_2) = B \exp\{i(w_2 t + \phi_2 - \phi_a)\} \qquad (11)$$

$$Eb'(f_1) = A \exp\{i(w_1 t + \phi_1 + \phi_b + (2\pi/\lambda)\cdot\beta d)\} \qquad (12)$$

$$Eb'(f_2) = B \exp\{i(w_2 t + \phi_2 - \phi_b - (2\pi/\lambda)\cdot\beta d)\} \qquad (13)$$

where $\phi_1$ and $\phi_2$ are initial phases, and $\phi_a$ and $\phi_b$ are phases corresponding to the positional deviation.

Due to the interference between $Ea'(f_1)$ and $Ea'(f_2)$, it follows that:

$$Ia' = |Ea'(f_1) + Ea'(f_2)|^2 = A^2 + B^2 + 2\cdot A \cdot B \cos\{(w_1 - w_2)t + (\phi_1 - 100_2) + 2\phi_a\} \qquad (14)$$

Due to the interference between $Eb'(f_1)$ and $Eb'(f_2)$, it follows that:

$$Ib' = A^2 + B^2 + 2\cdot A \cdot B \cos\{(w_1 - w_2)t + (\phi_1 - \phi_2) + 2\phi_b - 2\cdot(2\pi/\lambda)\cdot\beta d\} \qquad (15)$$

From equations (14) and (15) it is seen that, as compared with a case where $\theta_z = 0$, namely, a case of Y-component $\beta = 0$ of the direction cosine of the projected lights 67 and 68, in a case where $\theta_z \neq 0$ (namely, $\beta \neq 0$), the phase shifts by $(4\pi/\lambda)\cdot\beta d$.

It follows from this that, if the error corresponding to the deviation between the grating patterns 53 and 54 is denoted by $\Delta X'$, it is expressed as:

$$\Delta X' = 2\beta d \qquad (16)$$

The value corresponding to ΔX'=5 nm is, if d=100 microns:

$$\begin{aligned}\beta &= \Delta X'/(2d) \\ &= 5(nm)/(2 \times 100)(microns) \\ &= 2.5 \times 10^{-5} \\ \theta_z &= 90 \text{ (deg.)} - \cos^{-1}\beta \\ &= 5.1"\end{aligned}$$

Namely, a change of $\theta_z$ of 5.1" causes a change of 5 nm in the measured value of the deviation between the grating patterns 53 and 54. This means that a relative change of 5.1" between the detection optical system and the wafer 55 corresponding to rotation along the wafer surface plane results in an error of 5 nm. Thus, high precision detection is difficult to accomplish.

Usually, in an exposure apparatus for manufacture of semiconductor devices, a wafer stage moves a 6-inch or 8-inch wafer. In order to avoid rotation of second order in this movement, complicated monitoring function and control are necessary. If the stage movement is provided by using a simple structure, second order rotation, that is, yawing, will be produced, and it becomes quite difficult to avoid an error of detection of resultant deviation.

Further, it is difficult to avoid detection error to be caused in the grating pattern drawing operation or during an exposure operation or any other process, due to local rotational deviation of the wafer along its surface.

SUMMARY OF THE INVENTION

It is accordingly an object of the present invention to provide an improved deviation detecting method and/or system by which a rotational deviation of an object can be measured very precisely.

It is another object of the present invention to provide an apparatus with a rotational deviation detecting system, the apparatus being of the type that its performance is able to be affected by a rotation of an object.

In accordance with an aspect of the present invention, there is provided a deviation detecting system for detecting a rotational deviation of an object, said system comprising: a pattern formed on the object and having a periodicity; a light source for providing light; detecting means for projecting the light from said light source onto the pattern and for detecting at least two diffraction lights from the pattern with a predetermined detection plane; and determining means for determining a rotational deviation of the object with respect to a predetermined axis, on the basis of the positions of incidence of the diffraction lights upon the detection plane as detected through the detection by said detecting means.

In one preferred form of the invention in this aspect, the pattern comprises a diffraction grating.

In one preferred form of the invention in this aspect, the pattern comprises a circuit pattern.

In one preferred form of the invention in this aspect, said at least two diffraction lights have different diffraction orders.

In one preferred form of the invention in this aspect, the diffraction orders of said at least two diffraction lights have the same absolute value.

In one preferred form of the invention in this aspect, said light source comprises a laser.

In one preferred form of the invention in this aspect, the system further comprises an optical system provided in a path of light from said laser to said detecting means, wherein said optical system serves to image a beam waist of said laser on said predetermined detection plane.

In one preferred form of the invention in this aspect, the system further comprises a rotatable holder for holding the object and control means for rotating said holder on the basis of the rotational deviation determined by said determining means.

In accordance with another aspect of the present invention, there is provided a deviation detecting system for detecting a positional deviation between first and second diffraction gratings provided on an object, said system comprising: a rotatable table for holding the object; a light source for providing light; first detecting means for projecting the light from said light source onto at least one of the first and second diffraction gratings and for detecting at least two diffraction lights from said at least one diffraction grating with a predetermined detection plane; determining means for determining a rotational deviation of the object with respect to a predetermined axis, on the basis of the positions of incidence of the diffraction lights upon the detection plane as detected through the detection by said first detecting means; second detecting means for detecting information related to positional deviation between the first and second diffraction gratings; and control means for rotating said holder on the basis of the rotational deviation determined by said determining means, said control means further being operable to subsequently cause said second detecting means to detect information related to the positional deviation between the first and second diffraction gratings.

In one preferred form of the invention in this aspect, said second detecting means includes (i) illuminating means for projecting first and second lights from said light source onto the first and second diffraction gratings along different directions, (ii) first signal detecting means for detecting a first interference light signal based on a combination of diffraction light of the first light and diffraction light of the second light, both from the first diffraction grating, (iii) second signal detecting means for detecting a second interference light signal based on a combination of diffraction light of the first light and diffraction light of the second light, both from the second diffraction grating, (iv) phase difference detecting means for detecting a phase difference between the first and second interference signals, and (v) deviation determining means for determining a relative positional deviation between the first and second diffraction gratings on the basis of the phase difference detected by said phase difference detecting means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 15 is a schematic view of a main portion of a rotational deviation detecting system according to a second embodiment of the present invention.

DESCRIPTION OF THE PREFERRED EMBODIMENTS

Figure 1:
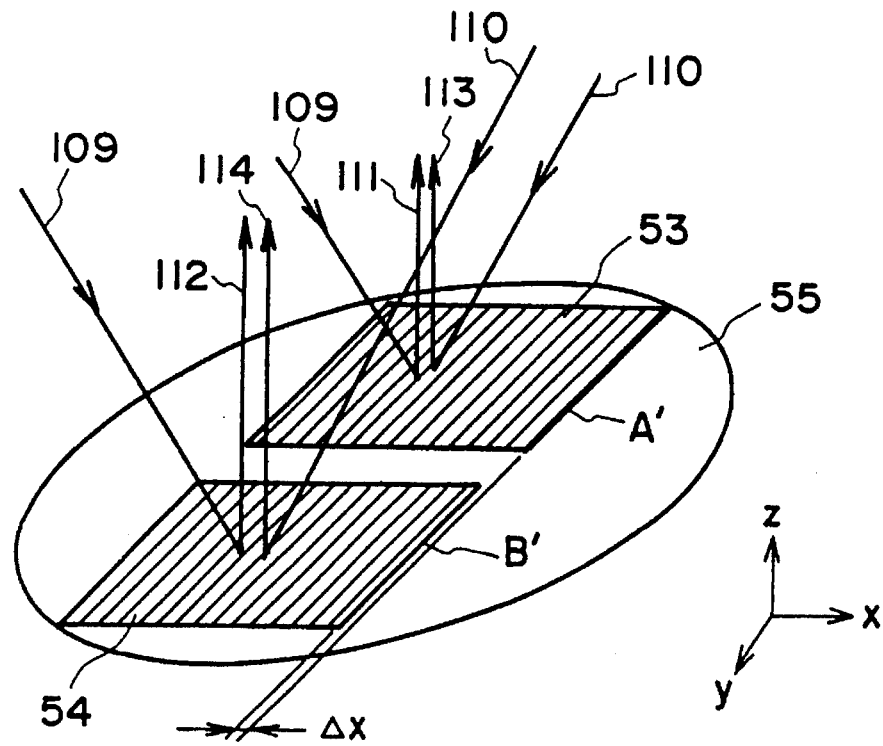
FIG. 1 is a schematic view for explaining the principle of detection in a known type positional deviation detecting system.
Figure 2:
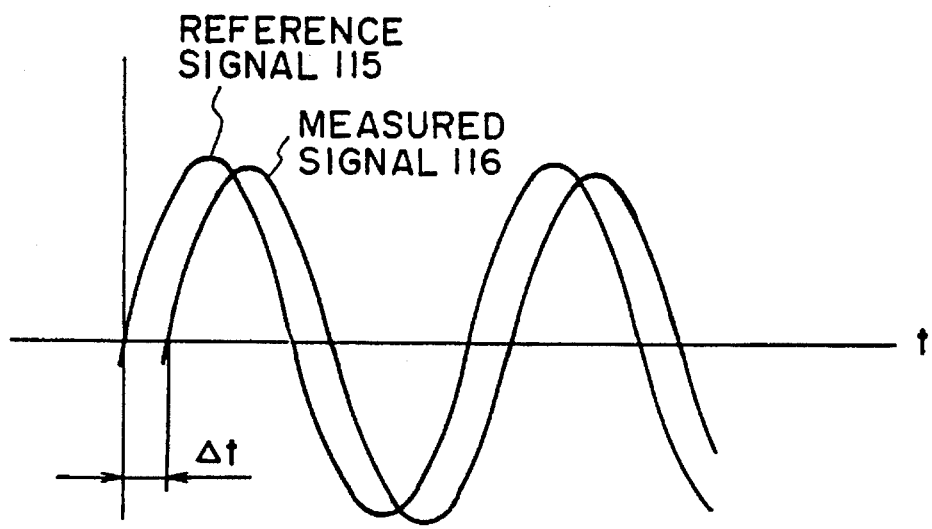
FIG. 2 is a graph for explaining output signals from light receiving means in a known type positional deviation detecting system.
Figure 3:
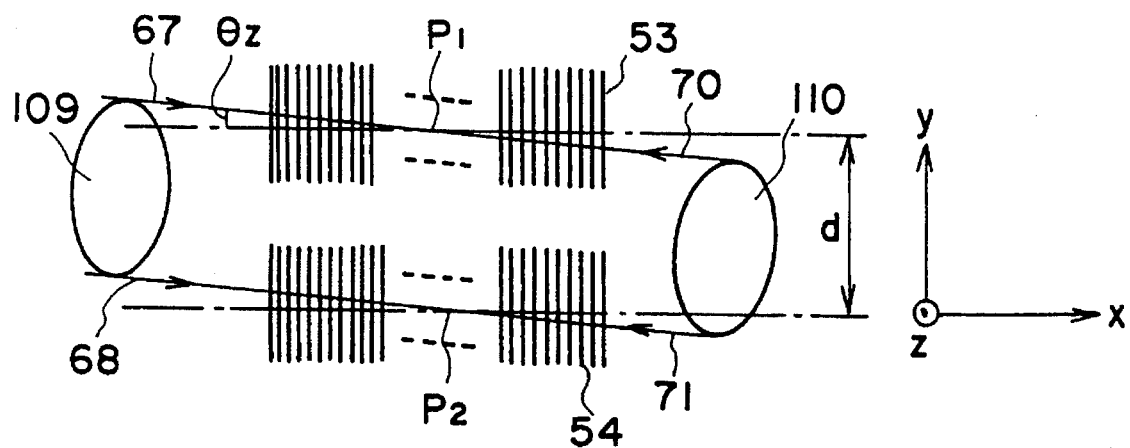
FIGS. 3 and 4 are schematic views, respectively, for explaining a relationship between diffraction gratings and light projected thereon, in a known type positional deviation detecting system.
Figure 4:
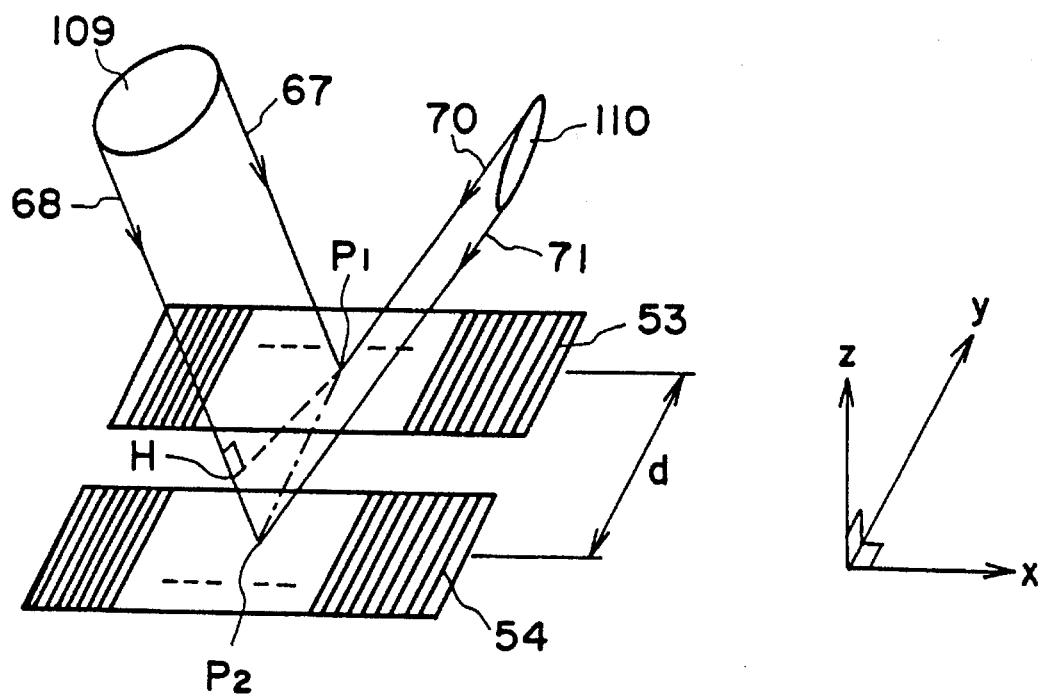
Figure 5A:
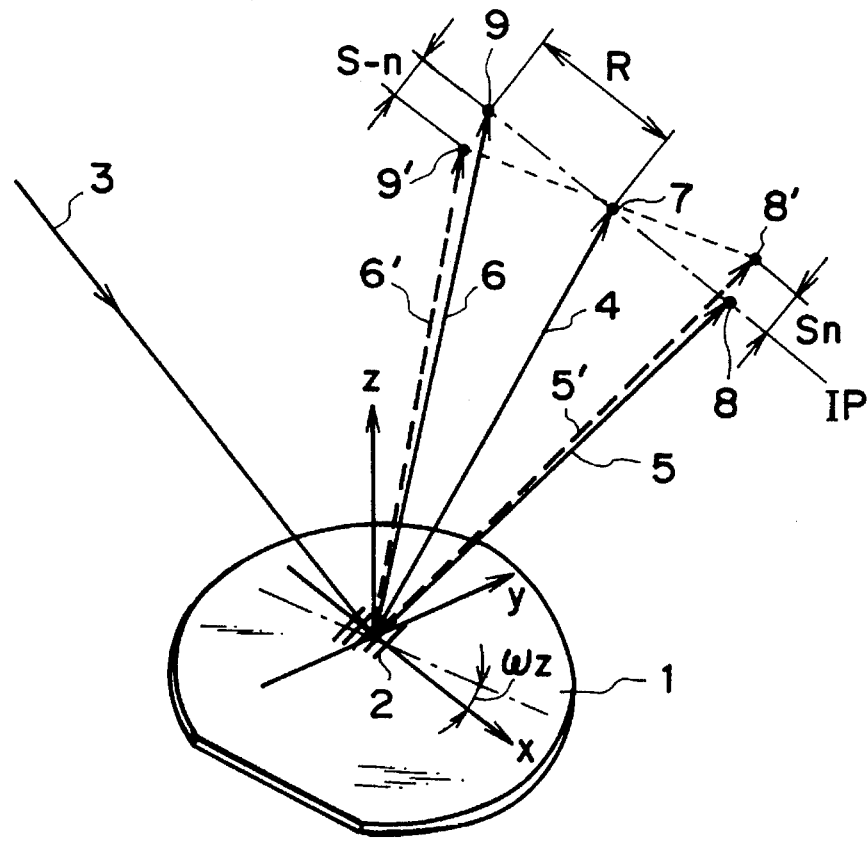
FIGS. 5A and 5B are schematic views, respectively, for explaining a basic concept of a rotational deviation detecting system according to the present invention.

FIG. 5 is a schematic view for explaining the basic concept of a rotational deviation detecting system of the present invention, for detecting information about a rotational deviation.

Denoted at 1 in the drawing is an object which is going to be examined for detection of rotational deviation information.

In FIG. 5, a light beam 3 from light source means (not shown) is projected on a diffraction grating 2 provided on an object 1. In response, the diffraction grating 2 produces zeroth order diffraction light 4, n-th order diffraction light 5 and negative n-th order diffraction light 6 and so on.

Now, a coordinate system such as shown in FIG. 5 is defined, wherein the direction of a normal to the diffraction grating 2 of the object 1 is denoted by Z, the angle of rotational deviation with respect to the Z axis is denoted by $w_z$, a reference direction with respect to which the rotational deviation is taken is denoted by X, and a direction perpendicular to both of these directions is denoted by Y.

The diffraction grating 2 comprises straight grating elements of regular pitch, the direction of pitch lying along the X direction and the plane of incidence lying along the Y-Z plane, while in this state the light beam 3 is projected onto the diffraction grating 2. Of diffraction light from the diffraction grating 2, zeroth order diffraction light 4 is being regularly reflected along the Y-Z plane symmetrically with respect to the Z axis.

Now, an imaginary plane IP spaced by a predetermined distance L from the center of the diffraction grating 2 and being perpendicular to the zeroth order diffraction light 4, is considered. This plane may usually be used as a detection plane. A point denoted at 7 is taken as the central point of incidence of the zeroth order diffraction light upon the imaginary plane IP. It follows that n-th order diffraction light 5 and negative n-th order diffraction light 6, being diffracted by the diffraction grating 2, are incident at positions 8 and 9 on the imaginary plane IP, spaced by the same distance R from the center 7 of incidence of the zeroth order diffraction light 4 and being symmetrical with each other with respect to the center 7.

If there is no rotational deviation, that is, if $w_z=0$, the straight line connecting the points 8 and 9 is parallel to the reference direction X. A reference direction may of course be determined beforehand. If the object 1 has a rotational deviation $w_z$, on the other hand, the diffraction lights 5 and 6 change into diffraction lights 5' and 6' in accordance with (or in proportion to) its rotational angle, and they shift rotationally about the center of the incidence point 7 of the zeroth order diffraction light 4. Thus, the lights 5' and 6' come to the positions denoted by 8' and 9', respectively.

If the rotational deviation $w_z$ is not very large, the movement direction is orthogonal to a direction connecting the zeroth order diffraction light 4 and the diffraction light 5 (6) in the reference state. If the movement amounts are denoted by $S_n$ and $S_{-n}$, then the deviation is expressed by:

$$w_z = (S_n - S_{-n})/(2R) \tag{17}$$

Here, the movement amounts $S_n$ and $S_{-n}$ are displaceable in opposite directions in response to the rotational deviation. If the distance R is made large and if the movement amounts $S_n$ and $S_{-n}$ are measured with high resolution, only a small rotational deviation $w_z$ of the object 1 can be detected.

If the pitch of the diffraction grating 2 is denoted by P, then the relations such as below:

$$P \sin \theta' = n\lambda \quad (18)$$

$$\tan \theta' = R/L \quad (19)$$

are established in accordance with the principle of diffraction of a diffraction grating.

From equations (18) and (19), it follows that:

$$R = L \tan \theta' = L \tan\{\sin^{-1}(n\lambda/P)\} \quad (20)$$

Thus, R can be set as desired in accordance with the distance L to the evaluation plane, the illumination wavelength $\lambda$, the diffraction order n and the diffraction grating pitch P.

On the other hand, any effect of motion of the object 1 other than the rotational deviation $w_z$ is canceled in the manner to be described later, and it does not result in a detection error. First, a positional deviation of the object 1 with respect to the X, Y and Z axes will now be described.

Case A

A case where the object 1 deviates in the X direction by x':

If the range of illumination of the diffraction grating 2 by the projected beam 3 with respect to the X direction is smaller than the diffraction grating 2, the incidence positions 8 and 9 of the diffraction beams 5 and 6 are unchanged. If the range of illumination is larger than the diffraction grating 2, the points of incidence of the diffraction beams 5 and 6 shift in the X direction by the same distance. Since it is in a direction perpendicular to the direction for detection of rotational deviation $w_z$, such shift does not lead to an error of rotational deviation detection.

Case B

A case where the object 1 deviates in the Y axis direction by y':

If the range of illumination of the diffraction grating 2 by the projected beam 3 with respect to the Y direction is smaller than the diffraction grating 2, the incidence positions 8 and 9 of the diffraction beams 5 and 6 are unchanged. If the range of illumination is larger than the diffraction grating 2, they shift in the direction of rotational deviation $w_z$ detection by the same amount $S_y'$. The rotational deviation $w_z$ detected is expressed by:

$$w_z = \{S_n + S_y' - (S_{-n} + S_y')\}/(2R)$$
$$= (S_n - S_{-n})/(2R)$$

Thus, it does not result in a rotational deviation detection error.

Case C

A case where the object 1 deviates in the Z direction by z':

Independently of the size of the projected beam 3 and the diffraction grating 2, the incidence points 8 and 9 of the diffraction beams 5 and 6 displace in the deviation $w_z$ detecting direction by an amount $S_z'$ proportional to z'. The rotational deviation detected is expressed by:

$$w_z = \{S_n + S_z' - (S_{-n} + S_z')\}/(2R)$$
$$= (S_n - S_{-n})/(2R)$$

Thus, it does not contribute to a deviation measurement error.

Next, the effect of tilt of the object 1 will be explained.

Case D

A case where there is a tilt $w_x'$ corresponding to rotation about the X axis:

Independently of the size of the projected beam 3 and the diffraction grating 2, the incidence points 8 and 9 of the diffraction beams 5 and 6 shift in the deviation $w_z$ detecting direction by an amount $Sw_x'$ proportional to $w_x'$.

The rotational deviation detected is expressed as:

$$w_z = \{S_n + Sw_x' - (S_{-n} + Sw_x')\}/(2R)$$
$$= (S_n - S_{-n})/(2R)$$

Thus, it does not lead to a deviation measurement error.

Case E

A case where there is a tilt $w_y'$ corresponding to rotation about the Y axis:

Independently of the size of the projected beam 3 and the diffraction grating 2, the incidence positions 8 and 9 of the diffraction beams 5 and 6 shift in a direction perpendicular to the deviation $w_z$ detecting direction by the same amount. Since it is in a direction orthogonal to the rotational deviation $w_z$ detecting direction, it does not end in a measurement error.

Figure 5B:
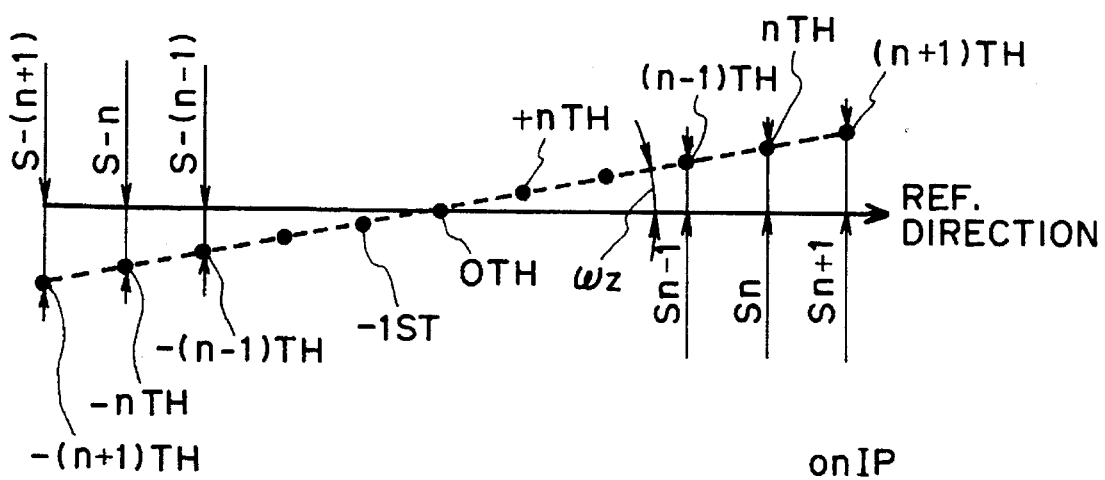

In the cases described above, the rotational deviation $w_z$ is determined on the basis of the amount of displacement of the incidence positions of positive and negative n-th order diffraction lights from a reference line on the imaginary plane. It is to be noted that on this imaginary plane there are incidence of diffraction lights of other orders, the incidence points being arrayed along a straight line with spacings as determined by the pitch of the pattern, as best seen in FIG. 5B. Therefore, even without using the positive and negative n-th order diffraction lights, the rotational deviation $w_z$ can be detected by detecting the amount of displacement of the incidence positions of at least two diffraction lights, on the straight line, from the reference line, this being readily understood from FIG. 5B.

Figure 6:
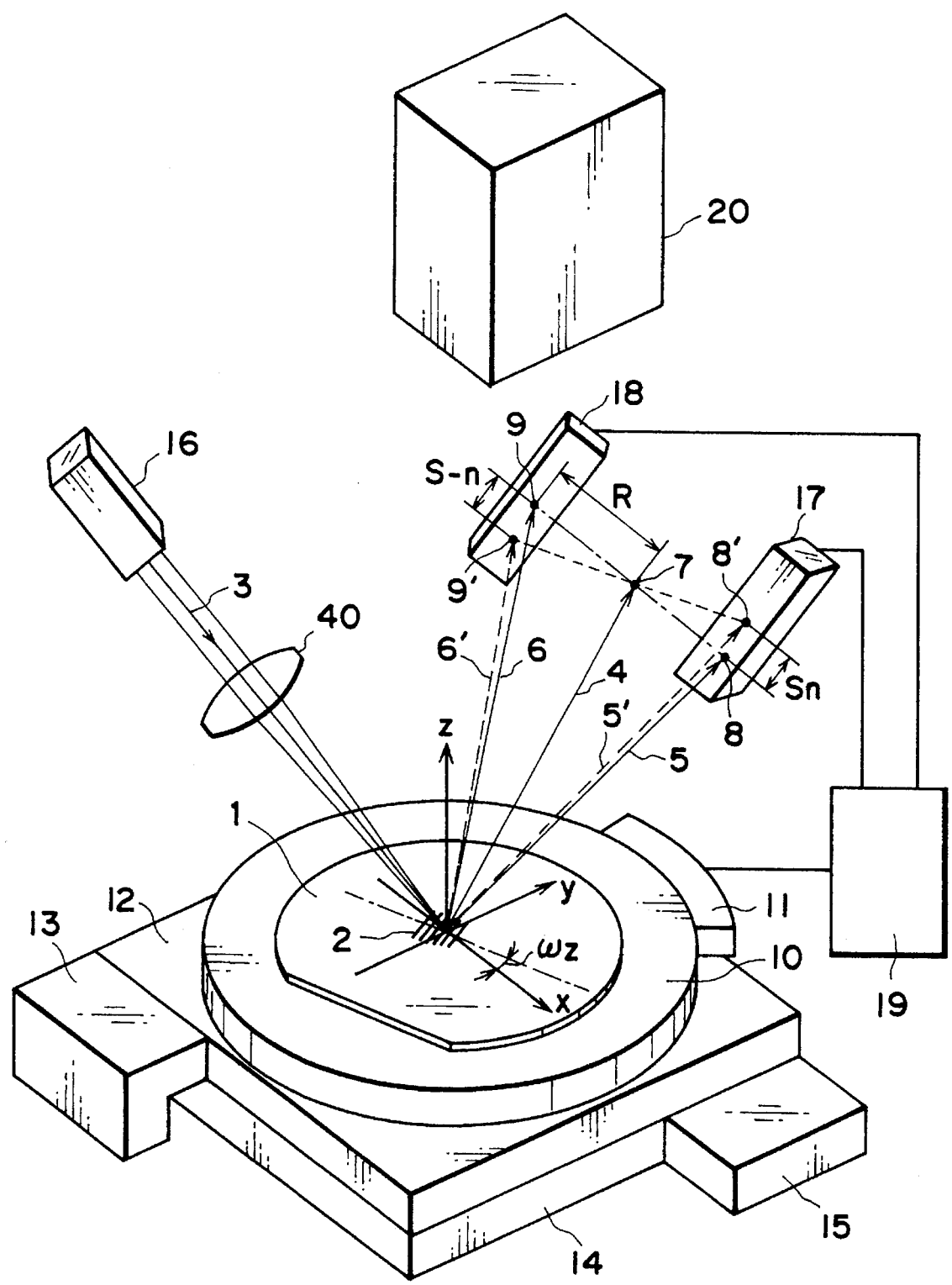
FIG. 6 is a schematic view of a main portion of a rotational deviation detecting system according to a first embodiment of the present invention.

FIG. 6 is a schematic view of a main portion of a first embodiment of the present invention, wherein the rotational deviation detecting system according to the invention is applied to a sample evaluating device.

In this embodiment, a sample 1 (such as a wafer or an object) is placed on a sample table 10 having a rotatable stage, and an evaluation means 20 of a microscope system is used for evaluation.

Denoted in FIG. 6 at 2 is a diffraction grating provided on the sample 1. Denoted at 11 is a rotation control system for the sample stage 10, denoted at 12 is a Y stage for moving the sample table in the Y direction, denoted at 13 is a control system for the Y stage 12, and denoted at 14 is an X stage for moving the sample stage in the X direction. Denoted at 15 is a control system for the X stage 14.

Denoted at 16 is a light projecting means of a rotational deviation detecting system, and denoted at 17 and 18 each is a detecting means (light receiving means) for detecting the position of incidence of light (diffraction light). Denoted at 19 is a computing means for computing a rotational deviation of the sample 1 on the basis of signals from the detecting means 17 and 18, and for signaling the rotational deviation to the rotation control system 11.

Referring to the flow chart of FIG. 7, the sequence of successive evaluations for small zones of the sample, placed on the sample 1, through the evaluation means 20, in the structure described above, will be explained.

Initially, as shown in FIG. 6, the reference with respect to the rotational direction is brought into alignment with the stage moving direction X (only one operation being required at the time of assembling, by using a microscope system 20, for example).

Then, the sample is placed and set on the sample table 14. Here, a rotational deviation $w_z$ along the plane of sample 1 may be present in dependence upon a setting error. This rotational deviation $w_z$ is to be evaluated by using the rotational deviation detecting system to be described. Light beam 13 emanating from the light projecting means 16 is projected onto the sample 1 through a condensing lens 40.

Subsequently, the sample stage 10 is moved by the stages 12 and 14 so that the light beam 3 irradiates the diffraction grating 2 provided on the sample 1. Rough alignment of the projected beam 3 and the diffraction grating 2 may be sufficient, and usually the stages 12 and 14 may be moved to predetermined positions with the setting error excluded.

Fine adjustment may not be necessary. However, it may be done by using the light quantity as detected by the detecting means 17 and 18 or by using an observation system of the microscope system 20.

The projected beam 3 is then diffracted by the diffraction grating 2, whereby diffraction lights of m-th order (m is an integer) are produced. Among these lights, the incidence positions 8' and 9' of positive and negative n-th order diffraction lights 5' and 6', having the same absolute values but having different signs, upon the surfaces of the detecting means 17 and 18 are to be detected.

The detecting means 17 and 18 each comprises a light position detecting sensor (e.g., a two-division sensor or a PSD), and each serves to produce an electric signal corresponding to the position of incidence of the light beam. Here, the computing means 19 calculates the difference $S_n$ ($S_{-n}$) between the reference position 8 (9) for the impingement of a light beam to the detecting means 17 (18) and the incidence positions 8' (9') of the positive (negative) n-th order diffraction light 5' (6') upon the detecting means 17 (18) surface.

From the differences $S_n$ and $S_{-n}$ as calculated by the computing means 19, the amount of correction of rotational deviation is determined in accordance with the following equation:

$$w_z = (S_n S_{-n})/(2R)$$

A value corresponding to the thus detected rotational deviation is signaled to the rotation control system 11. In response to the value applied, the rotation control system 11 rotationally moves the sample table 11 to correct the rotational deviation of the sample 1.

In this manner, the rotational deviation of the sample is corrected. After this, the stages 12 and 14 operate to set the sample 1 so that a zone of the sample 1 to be evaluated is positioned at the evaluation station of the evaluating means 20. Upon completion of evaluation of the entire sample 1, the evaluation-completed sample 1 is replaced by a next sample, and the evaluation operation is repeated in the sequence as described above.

In this embodiment, the diffraction grating 2 may have a pitch of 2 microns while the projected light 3 may be of a wavelength of 830 nm, and positive and negative second order diffraction lights may be received. The diffraction angles may be ±56 (deg.). The distance L to the evaluating surface of the light receiving system may be L=74.2 mm. The detection sensitivity for rotational deviation $w_z$ (rotational angle per 1 micron on the sensor surface) if R=110 mm, may be:

$$\begin{aligned} w_z' &= 1/(2 \times 110 \times 10^3) \\ &= 4.5 \times 10^{-6} \text{ (rad)} \\ &= 0.5 ('') \end{aligned}$$

Thus, rotational deviation detection on an order of seconds is attainable.

It is to be noted here that the projected beam 3, the diffraction grating 2 and the detecting means 17 and 18 may preferably be placed in the following imaging relationship.

The beam 3 projected from the light projecting means 16 generally has an intensity distribution of a Gaussian shape, and the shape of the beam as it is collected by the lens system 40 is given as follows:

If the beam diameter at the beam waist position is denoted by $W_0$, the coordinate in the advancement direction of the light (deviation from the beam waist) is denoted by u, and the wavelength is denoted by $\lambda$, then the beam radius W at the position u is expressed by:

$$W = W_0[1+(\lambda u/\pi W_0^2)^2]^{+e_{fra}\ 1/2} + ee$$

Figure 8:
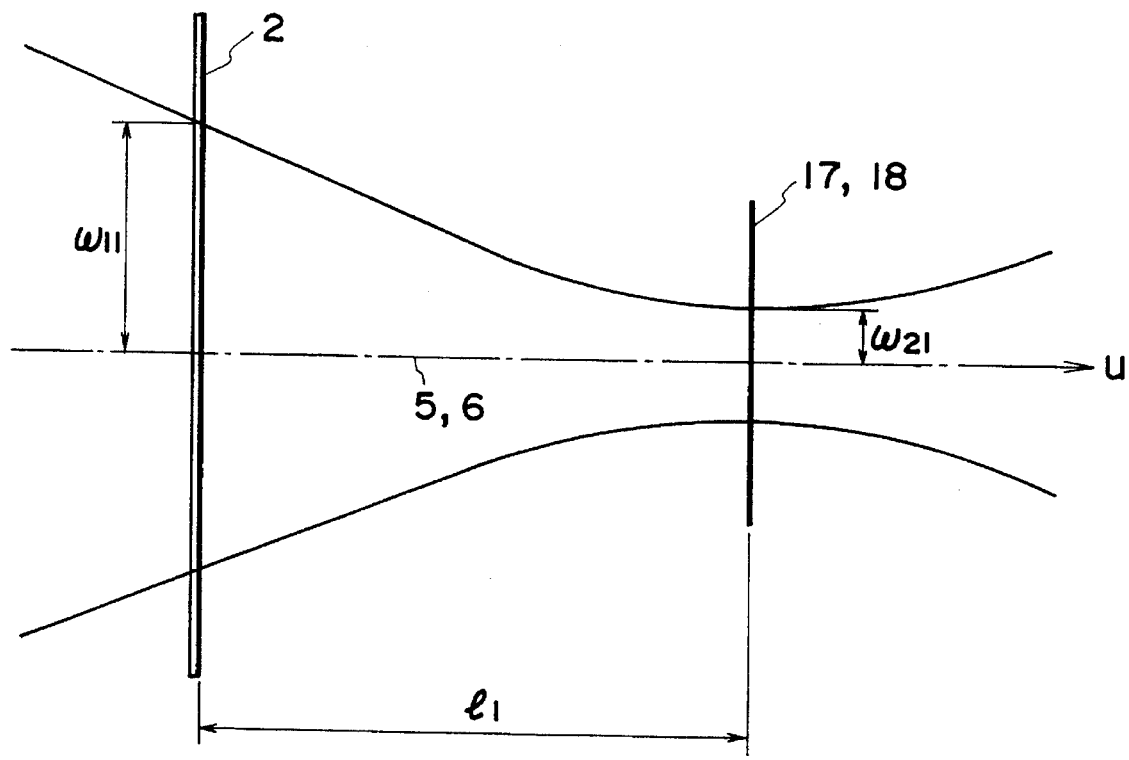
FIGS. 8, 9 and 10 are graphs, respectively, for explaining the positional relation between a projected beam, diffraction gratings and detecting means of the first embodiment.

If the diffraction grating 2 can be made sufficiently large, the light position detecting sensors 17 and 18 may preferably be disposed at the beam waist position as shown in FIG. 8 so as to minimize the beam diameter upon the sensor surface. On that occasion, if the distance between the grating 2 and the beam waist is denoted by $l_1$ and the beam waist radius is denoted by $W_{21}$, the beam radius $W_{11}$ upon the grating 2 surface is given by:

$$W_{11} = W_{21}[1+(\lambda l_1/\pi W_{21}^2)^2]^{+e_{fra}\ 1/2} + ee$$

In this embodiment, the actual distance from the grating 2 to the light position detecting sensor 17 (18) is $l_1$=74.2 mm. If the beam waist radius $W_{21}$=100 microns, then $W_{11}$=364 microns.

Figure 9:
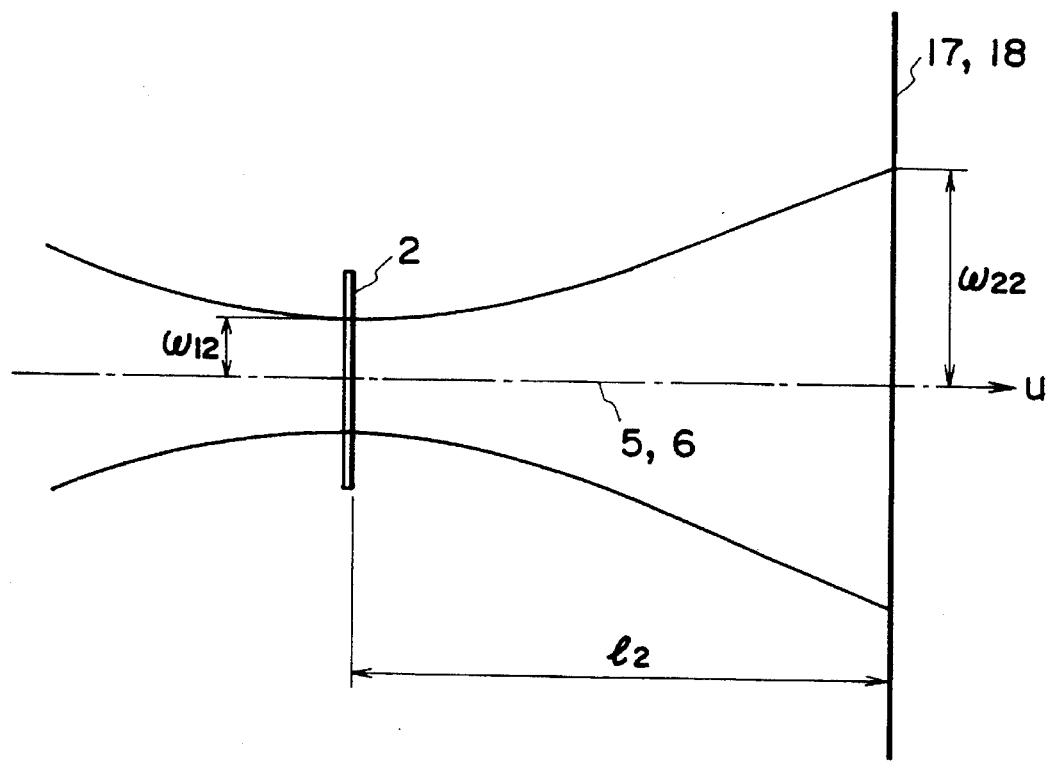

In a case where the diffraction grating 2 cannot be made so large due to the size of the article or for any other reason, the diffraction grating 2 may preferably be disposed at the beam waist position as shown in FIG. 9, and the distance $l_2$ to the light position detecting sensors 17 and 18 may preferably be set suitably so that the beam on the sensor surface does not expand largely (beyond the detection range on the sensor surface). On that occasion, the beam radius $W_{22}$ upon the sensor surface is given by:

$$W_{22} = W_{12}[1+(\lambda l_2/\pi W_{12}^2)^2]^{+e_{fra}\ 1/2} + ee$$

Figure 10:
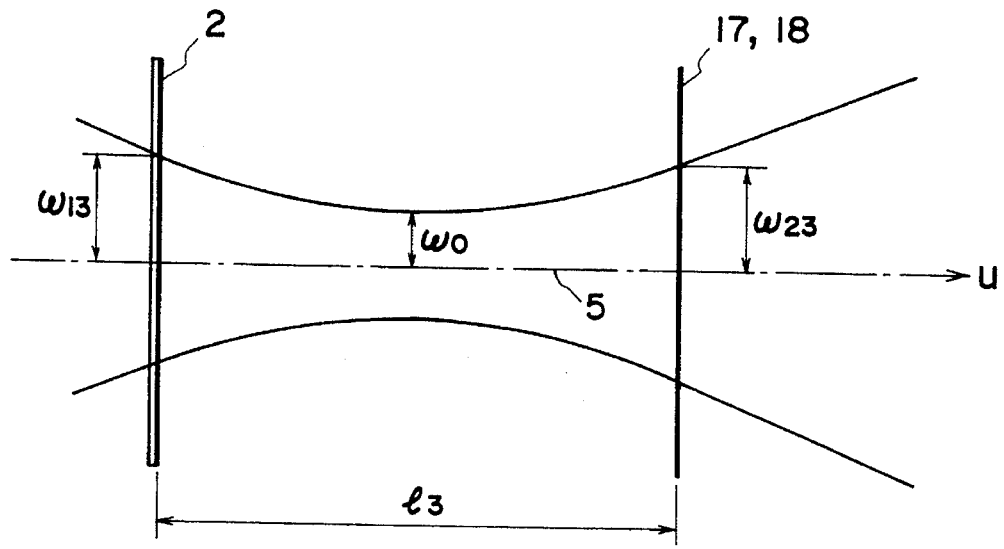

In a case where the diffraction grating 2 cannot be made so large while, on the other hand, the beam diameter at the light position detecting sensor 17 (18) is desired to be not so large, an intermediate state between the FIG. 8 case and the FIG. 9 case, namely, the disposition shown in FIG. 10 may be desirable: in which the beam waist position is set between the diffraction grating 2 and the light position detecting sensor 17 (18).

Figure 12:
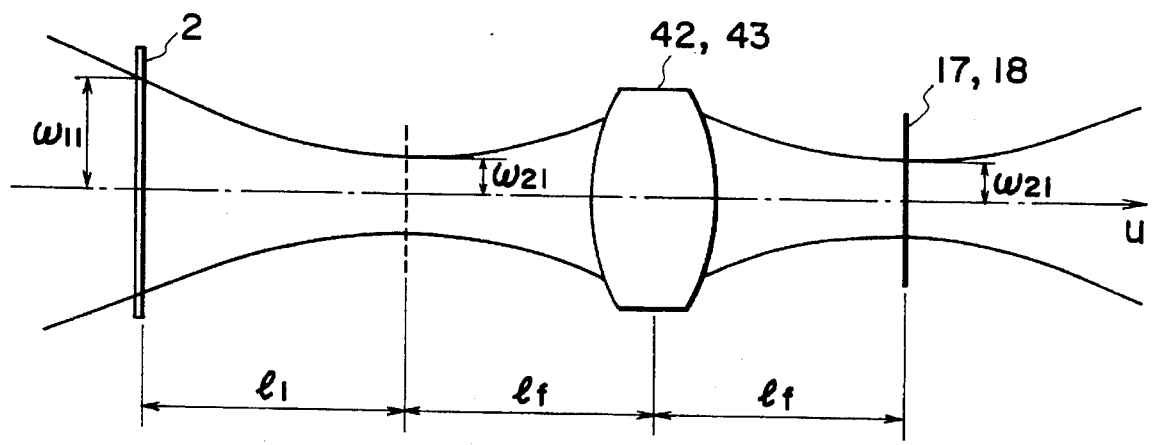
FIG. 12 is a graph for explaining the positional relation between a projected beam, diffraction gratings and detecting means of the FIG. 11 example.
Figure 11:
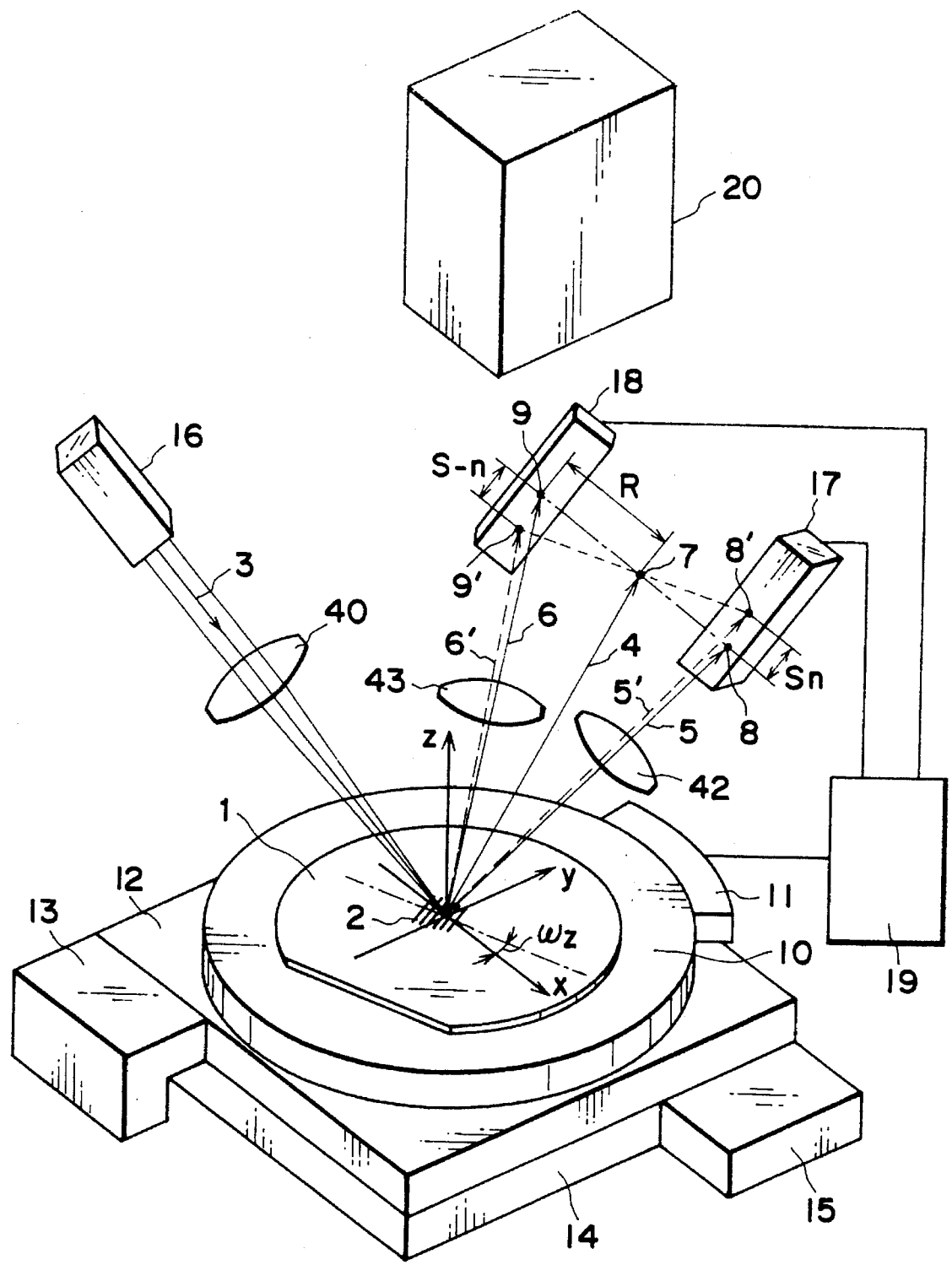
FIG. 11 is a schematic view of a main portion of a modified form of the first embodiment.

FIG. 11 shows an example wherein relay lens systems 42 and 43 are added to the detection system of FIG. 6. The imaging relationship is such as shown in FIG. 12, wherein the light position detecting sensor surface in the imaging relation shown in FIG. 8 is shifted to an optically conjugate position by means of the relay lens system 42 or 43. The relay lens system provides unit magnification imaging, and thus the sensitivity to rotational deviation as well as the beam diameter on the sensor surface are equivalent to those of the FIG. 8 case.

Figure 13:
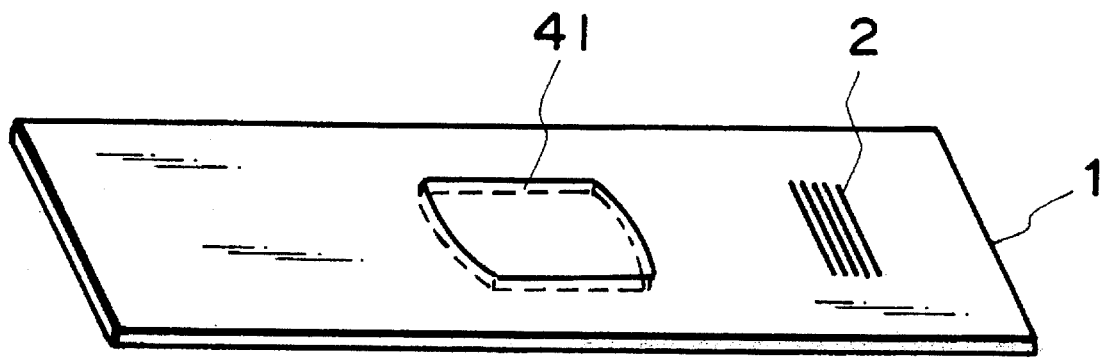
FIGS. 13 and 14 are schematic views, respectively, for explaining a diffraction grating on a sample.
Figure 14:
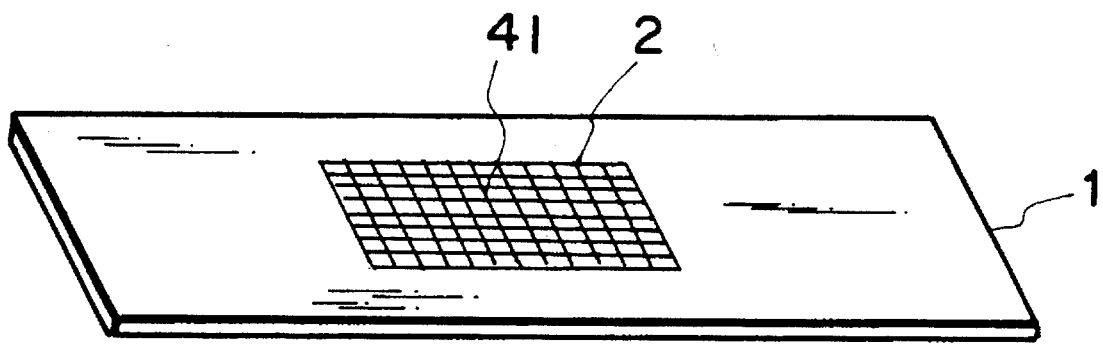

FIGS. 13 and 14 each shows an example wherein a diffraction grating 12 is provided on a sample plate 1, in place of the sample 1. In FIG. 13, the diffraction grating 2 is disposed at a location spaced away from the position 41 where the sample is to be placed. In FIG. 14, the diffraction grating 12 is in the same region as the position where the sample is to be placed. In this case, the diffraction grating 2 comprises a mesh-like pattern. The region in which the sample is to be placed may be formed with mesh, so that it functions also as a grating for rotation detection.

FIG. 15 is a schematic view of a main portion of a second embodiment of the present invention, wherein a rotational deviation detecting system of the present invention is applied to a sample evaluation device.

This embodiment differs from the first embodiment of FIG. 6 in that reference marks 21 and 22 for rotational deviation are provided on the sample table 10. The remaining portion has substantially the same structure as that of the first embodiment.

Figure 7:
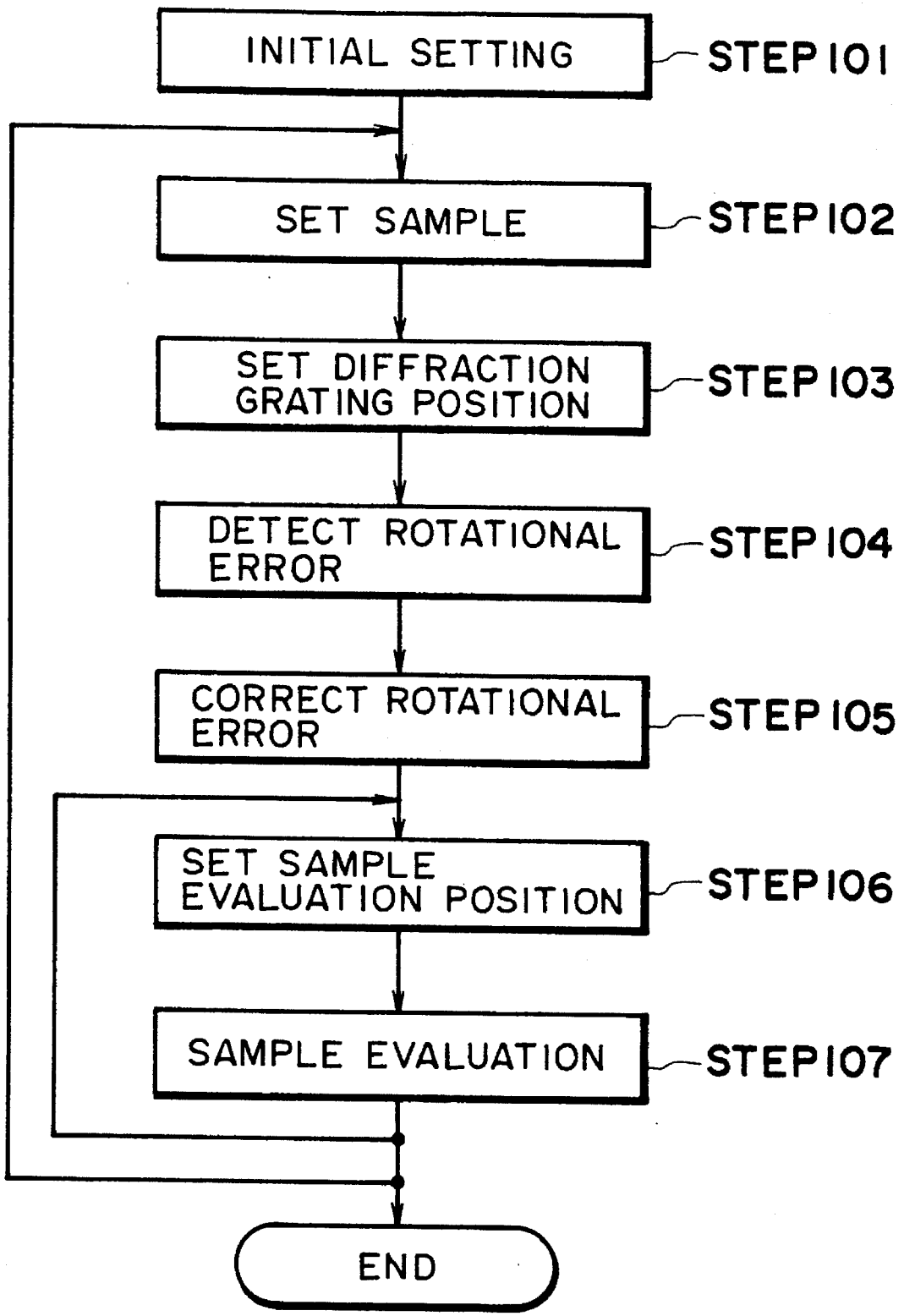
FIG. 7 is a flow chart of the operation of the first embodiment of FIG. 6.

In this embodiment, at the initial setting step of the flow chart of FIG. 7, through the stage movement for the sample table 1 in the X direction, alignment of the direction connecting the rotational deviation reference marks 21 and 22 with the stage movement direction is accomplished. Thereafter, a light beam is projected to one of the reference marks 21 and 22, and the incidence positions 8 and 9 of diffraction lights produced from that reference mark and impinging on the detection systems 17 and 18 are taken as the reference.

Each reference mark 21 or 22 comprises a diffraction grating of a pitch of 2 microns, the same pitch as the rotation evaluating diffraction grating 2. The level of each reference mark 21 or 22 is set substantially at the same height as the diffraction grating on the sample 1.

Figure 16:
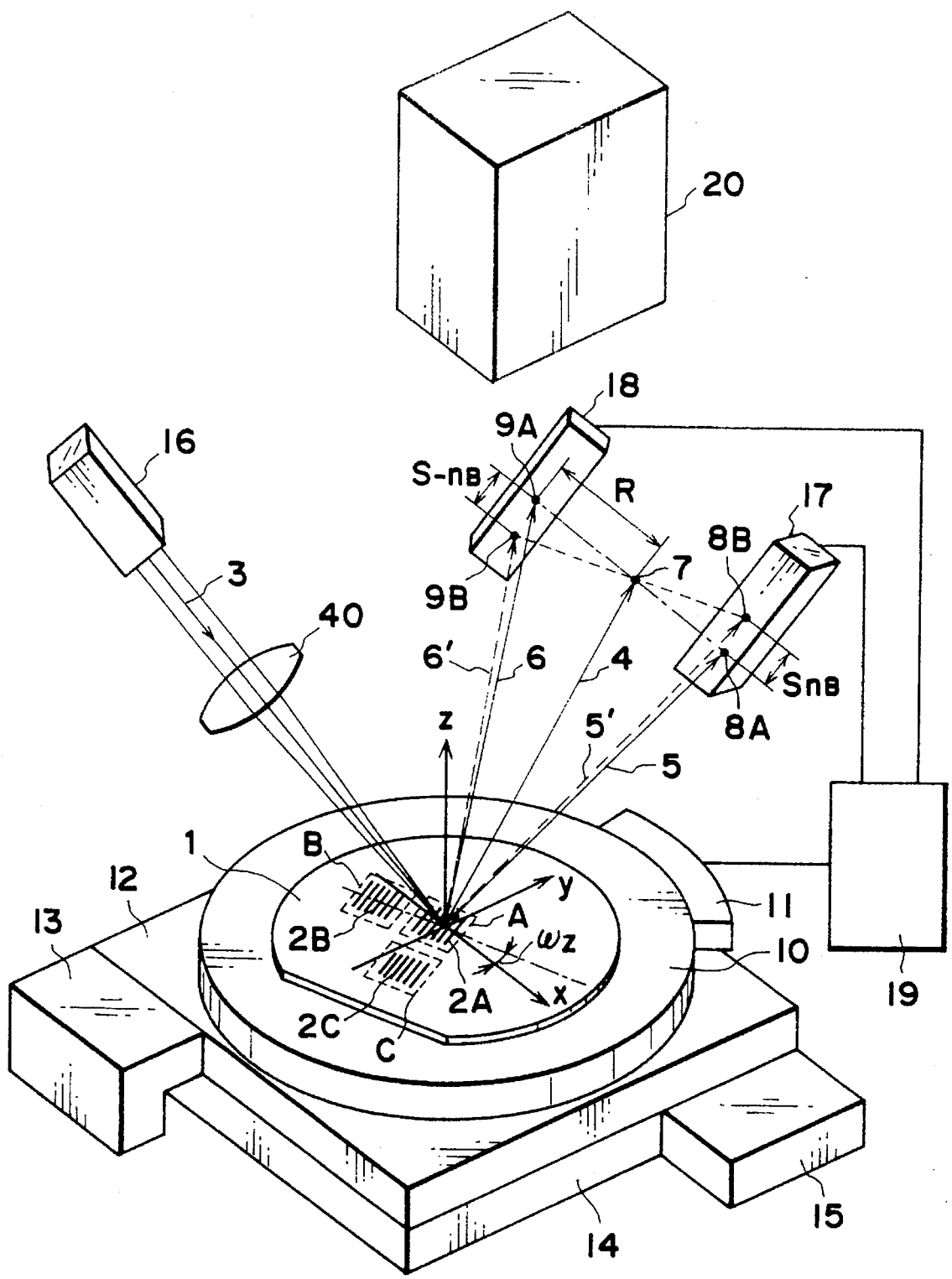
FIG. 16 is a schematic view of a main portion of a rotational deviation detecting system according to a third embodiment of the present invention.

FIG. 16 is a schematic view of a main portion of a third embodiment of the present invention, wherein a rotational deviation detecting system of the present invention is applied to a semiconductor device manufacturing exposure apparatus.

Figure 17:
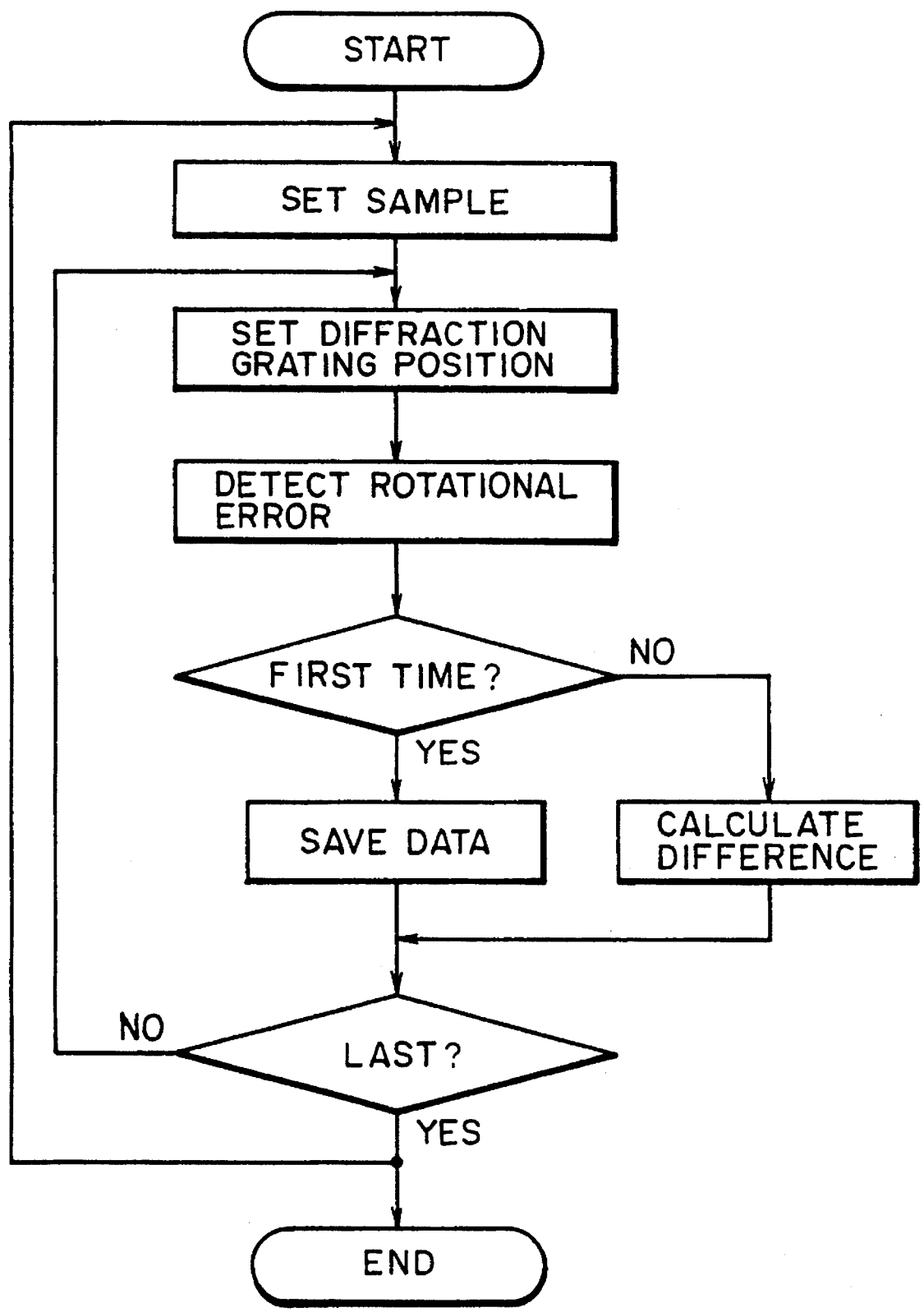
FIG. 17 is a flow chart of the operation of the third embodiment of FIG. 16.

Specifically, this embodiment is applied to evaluation of chip rotation in an exposure apparatus, and the light projecting and receiving system, the sample holding system, and the computing or other operating system are substantially of the same structure as that of the first embodiment. FIG. 17 is a flow chart of the operation to be made in this embodiment.

As seen from the flow chart of FIG. 17, this embodiment does not need initial setting. Sample 1 has plural zones (shots), three (A, B and C) in the illustration of FIG. 17, which have been defined by an exposure apparatus, not shown. Each zone has a diffraction grating 2A, 2B or 2C formed through a corresponding exposure process. These diffraction gratings 2A, 2B and 2C have the same pitch of 2 microns.

The sample is first set on the sample stage 10, and the stages 12 and 14 are then moved so that the diffraction grating 2A (zone A) comes to the rotational deviation evaluating station.

Light beam 3 from the light projecting means 16 is collected by a condensing lens 40 onto the diffraction grating 2A, and it is diffracted thereby. Positive and negative n-th order diffraction lights caused thereby are directed to the detecting means 17 and 18, and they are projected at positions 8A and 9A upon the surfaces of the detecting means 17 and 18, respectively.

In the first time zone (shot) detection, the detected positions are stored into the computing means 19. In the second time detection and in each of succeeding detecting operations, a deviation $w_{zB}$ with respect to the first time detected position is calculated. It is then converted into a relative rotational deviation angle from the zone (shot) A, and is memorized. The rotational deviation $w_{zB}$ is given by:

$$w_{zB} = (S_{nB} - S_{-nB})/(2R)$$

When the rotational deviation measurements to all the shots (zones) are completed, the obtained relative rotational deviations are combined to determine the chip rotation. The sample is then replaced by a next sample, and a similar measurement operation is repeated.

Figure 18:
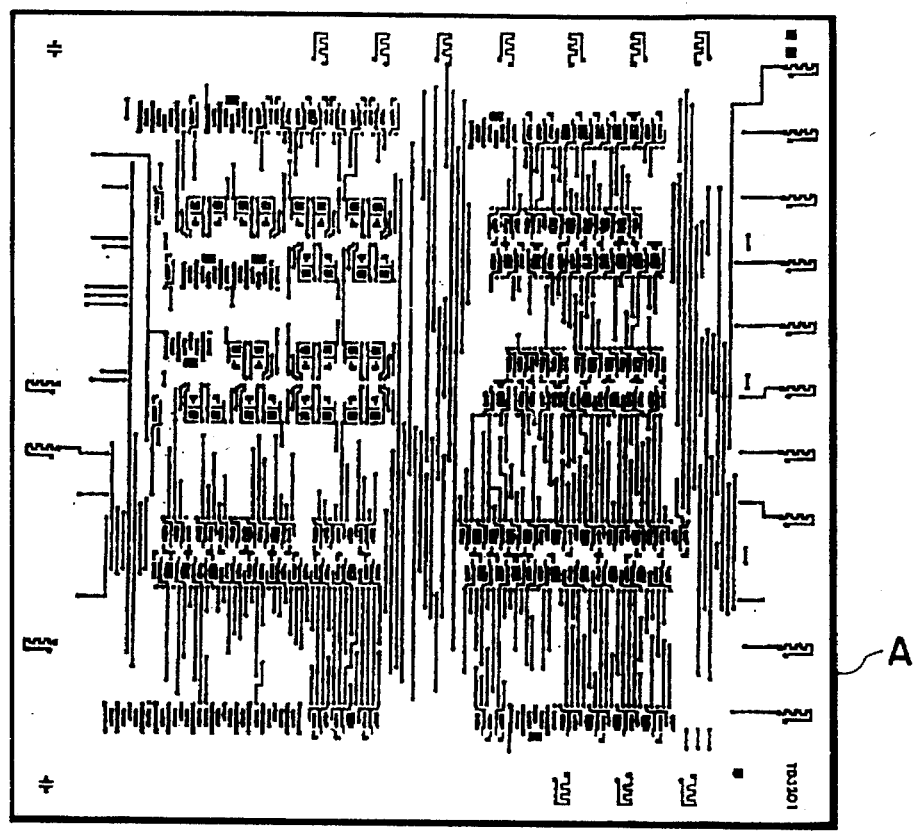
FIGS. 18 and 19 are schematic views, respectively, of examples of an integrated circuit.

FIG. 18 shows an example of an integrated circuit, that is, a unit cell type MOS-LSI source drain diffusion pattern arrangement. As will be readily understood from this drawing, the wiring pattern has a periodic structure. It is possible to detect a rotational component by projecting a light beam onto such a circuit pattern having periodicity and by detecting the positions of incidence of positive and negative n-th order diffraction lights.

Figure 19:
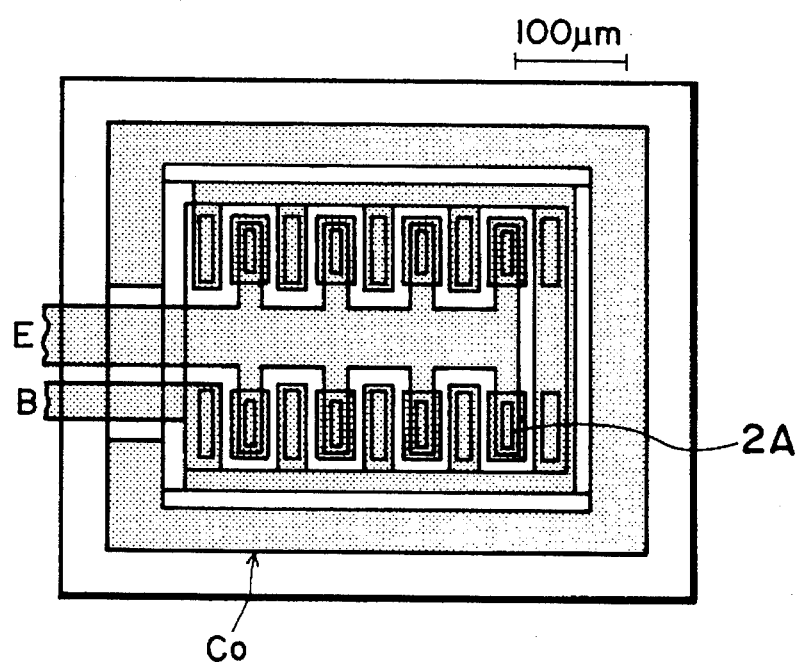

FIG. 19 shows another example of an integrated circuit, that is, a high voltage transistor with an increased number of emitters having a stripe-like structure. Denoted in the drawing at E is an emitter, denoted at Ba is a base, and denoted at Co is a collector. Even with such a dot-like grating, provided that it has a periodic structure, there occur positive and negative n-th order diffraction lights corresponding to its periodicity. Thus, they can be used to detect the rotational component.

Figure 20:
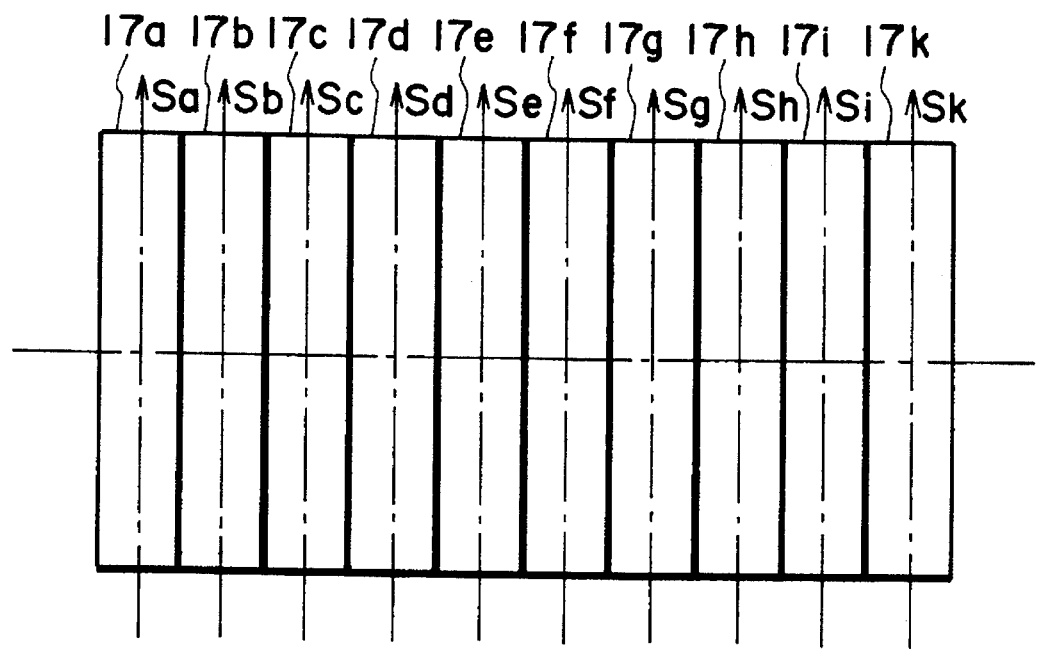
FIGS. 20 and 21 are schematic views, respectively, for explaining the structure of a light position sensor.
Figure 21:
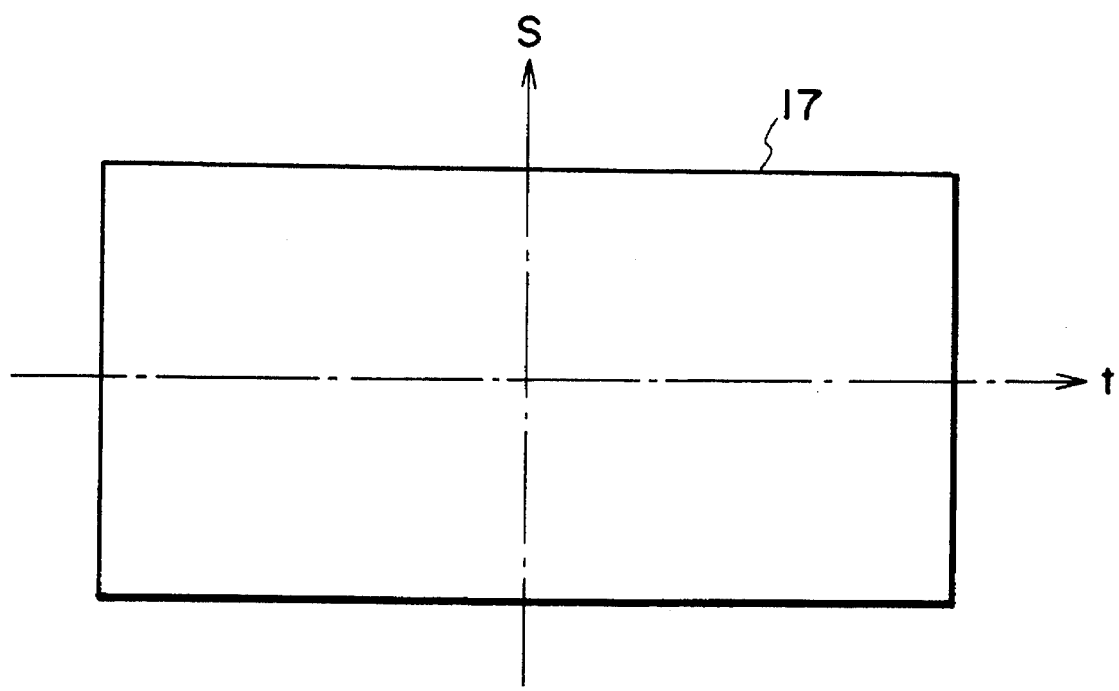

FIGS. 20 and 21 are schematic views, each for explaining an example of structure for the light position detecting sensor 17, suitable for detecting diffraction lights from such a circuit pattern and thus for detecting a rotational component.

Illustrated in FIG. 21 is an array of one-dimensional sensors. In accordance with the periodicity of a circuit used, those of the sensors to be used for light reception are selected. Light position detecting sensor means 18 has a similar structure, and suitable sensors are selected to receive diffraction lights.

FIG. 21 shows an array of two-dimensional sensors. Detection is made on the basis of the beam position in the S direction and in the t direction, according to the periodicity of a circuit used. The light position detecting sensor means 18 has a similar structure to produce a similar signal, and the rotational deviation is detected from the two signals.

Figure 22:
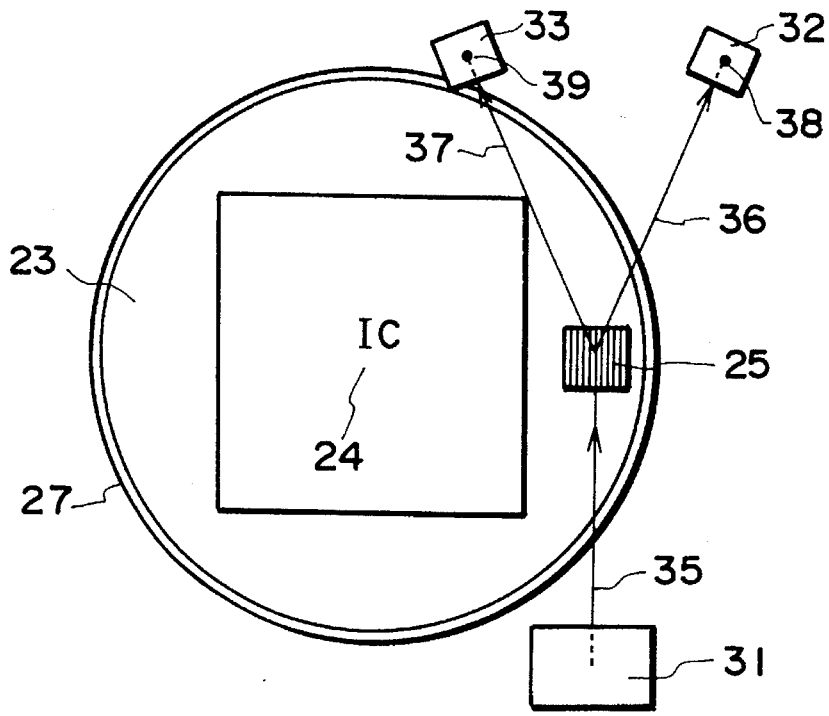
FIG. 22 is a schematic view of a main portion of a rotational deviation detecting system according to a fourth embodiment of the present invention.
Figure 23:
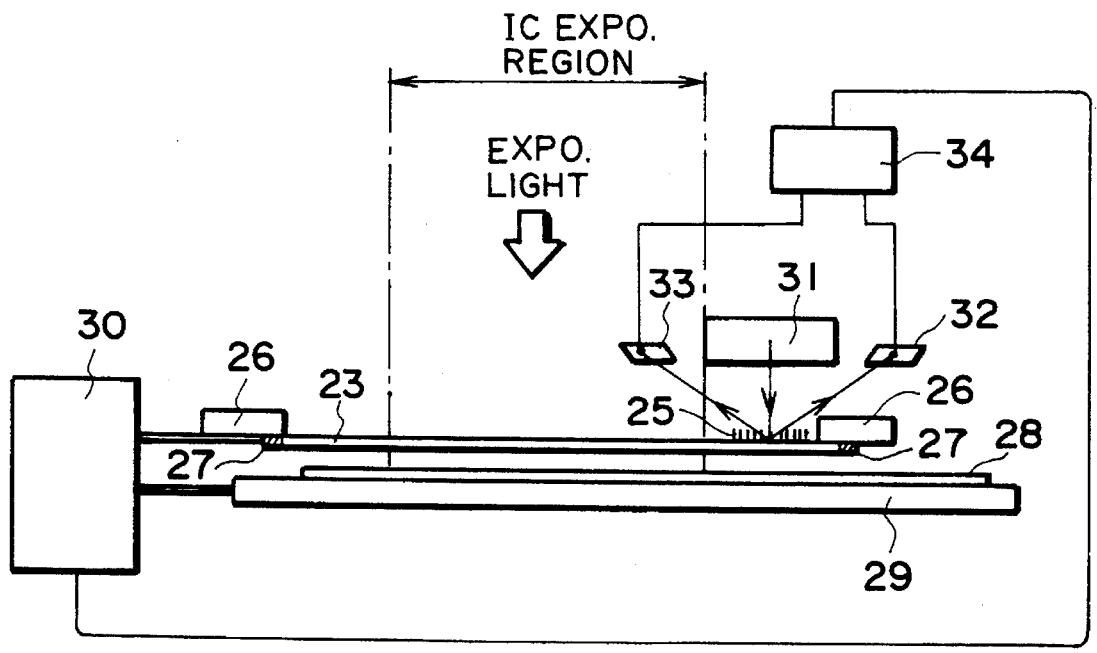
FIG. 23 is a sectional view of the fourth embodiment of FIG. 22.

FIGS. 22 and 23 are schematic views of a main portion of a fourth embodiment of the present invention, wherein a rotational deviation detecting system of the present invention is applied to a semiconductor device manufacturing exposure apparatus.

Specifically, this embodiment is applied to mask θ alignment in an exposure apparatus.

FIG. 22 is a schematic side view, as seen from the exposure side, and FIG. 23 is a schematic sectional view, the sheet containing the exposure axis. In FIGS. 22 and 23, denoted at 23 is a mask, denoted at 24 is an integrated circuit pattern on the mask, and denoted at 25 is a mark for mask alignment. Denoted at 27 is a mask holder for holding the mask 25, denoted at 26 is a mask θ rotation stage, and denoted at 28 is a wafer onto which the pattern of the mask 24 is to be transferred. Denoted at 29 is a wafer holder and stage, and denoted at 30 is a mask-and-wafer position control device for controlling the positions of the mask 25 and the wafer 28.

Denoted at 31 is a light projecting system of a mask θ rotation detecting system. It serves to project light on the mask alignment mark 25. Denoted at 32 and 33 are detecting means, respectively, for receiving positive and negative n-th order diffraction lights. Denoted at 34 is a computing means for calculating the mask θ deviation.

The mask θ alignment operation in a semiconductor exposure apparatus is such an operation that: in step-and-repeat exposures wherein an integrated circuit pattern of a mask is printed on a zone (shot) of a wafer and, thereafter, the wafer is moved stepwise to the position for exposure of a next zone (shot), this being done repeatedly for all the zones (shots), the mask θ alignment is done to attain alignment of the wafer movement direction with the rotational direction, along the surface, of the integrated circuit in each zone (shot) to thereby increase the area efficiency; and also it is done to increase the printing efficiency in superposed printing using many masks.

Figure 24:
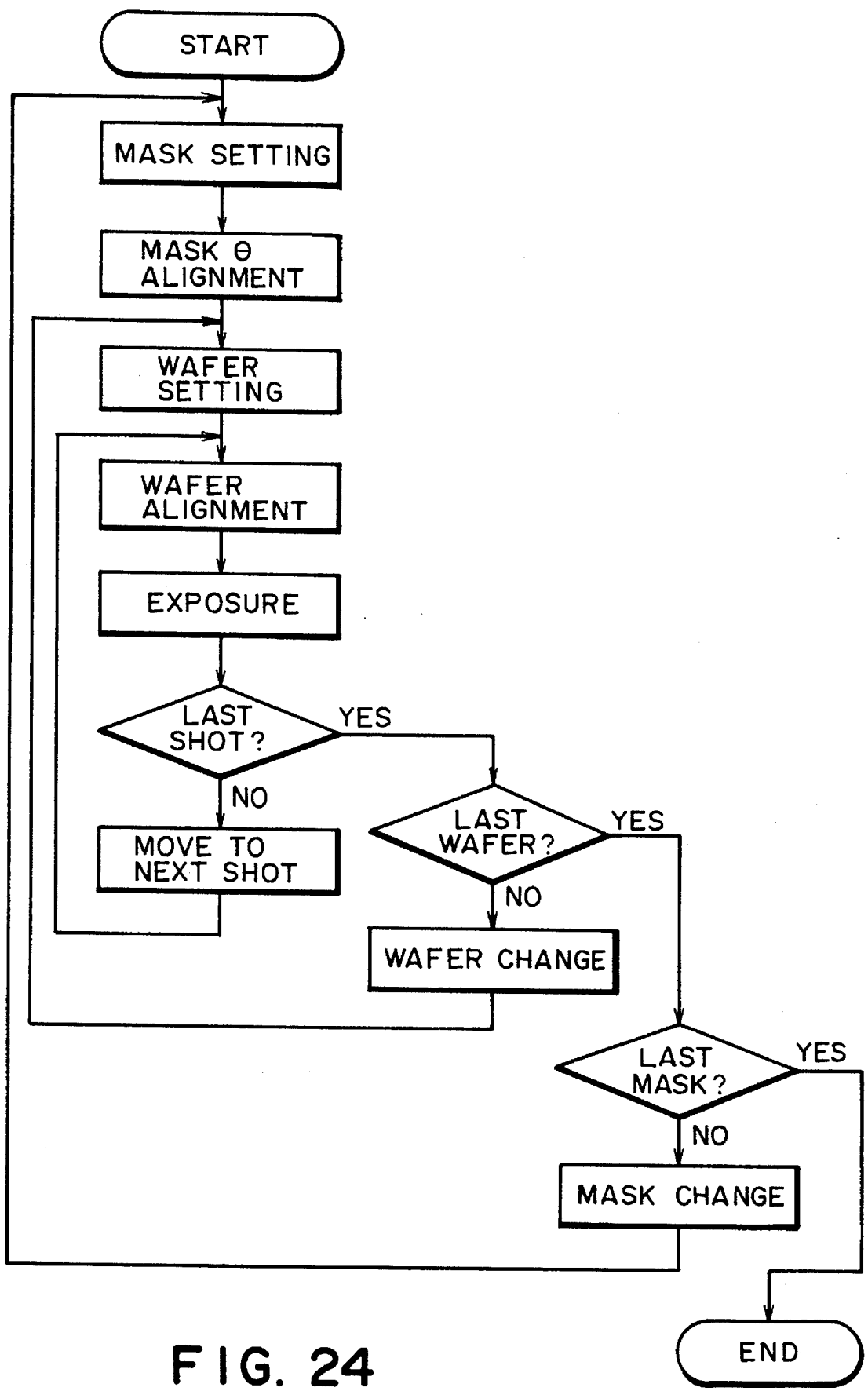
FIG. 24 is a flow chart of the operation of the fourth embodiment of FIG. 22.

FIG. 24 shows an ordinary exposure sequence. First, a mask is set, and then the mask θ alignment is done. In this alignment operation, the mask rotation is positioned with respect to a predetermined position within the exposure apparatus.

Subsequently, a wafer is loaded and a wafer alignment operation is done with respect to a particular shot, the exposure operation being done in response to completion of the wafer alignment operation. Then, while changing the wafer position, the exposures are repeated. After all the shots (zones) of the wafer are exposed, the wafer is replaced by another, and similar operations are made repeatedly. If the exposure operations using one and the same are completed, each wafer is then subjected to processes such as a developing process, for example. The mask having been used is then replaced by another, and the operations started with the mask setting operation are repeated.

Now, the mask θ alignment system will be explained.

Light 35 emitted by light projecting means 31 irradiates a diffraction grating 25 provided on the mask 23. In response, positive and negative n-th order diffraction lights 36 and 37 are produced by the diffraction grating 25. These diffraction lights are directed to the detecting means 32 and 33. Then, the incidence positions 38 and 39 of the diffraction lights 36 and 37 upon the surfaces of the detecting means 32 and 33 are detected. The information related to the incidence positions 38 and 39 as detected by the detecting means 32 and 33, is transformed into corresponding electric signals. The computing means 34 then calculates the rotational angle by using the information, now transformed into electric signals, and it produces a mask θ rotational deviation signal.

Then, the mask and wafer position control device 30 drives the mask stage 26 so as to reduce the thus detected mask θ rotational deviation angle to a value not larger than a predetermined tolerance.

In a particular example, the diffraction grating 25 of the mask 23 had a pitch of 2 microns, the distance L to the evaluating surface of the light receiving system was L=148 mm, and it had a size of 1000×1000 (micron). The light projected by the light projecting means 31 had a wavelength λ of 830 nm, and the system was set to receive positive and negative second order diffraction lights.

The R determining the sensitivity was 220 mm. The result is:

$$w_z' = 1/(2 \times 220 \times 10^3)$$
$$= 2.3 \times 10^{-6} \text{ (rad)}$$
$$= 0.25 \text{ (")}$$

Thus, rotational deviation detection of a sub-second order is possible, and high precision alignment is attainable.

In the rotational deviation detecting systems of the first to fourth embodiments described above, a diffraction grating is provided on an object to be subjected to the rotational deviation measurement. A light beam is projected onto this diffraction grating, and a difference, in motion along a predetermined direction, between positive and negative n-th order diffraction lights (n is an integer) among those diffraction lights as produced by the diffraction grating, is detected. This ensures high precision detection of rotational deviation, of an order not larger than a second, independently of the position of the center of rotation or of any setting deviation.

Figure 25:
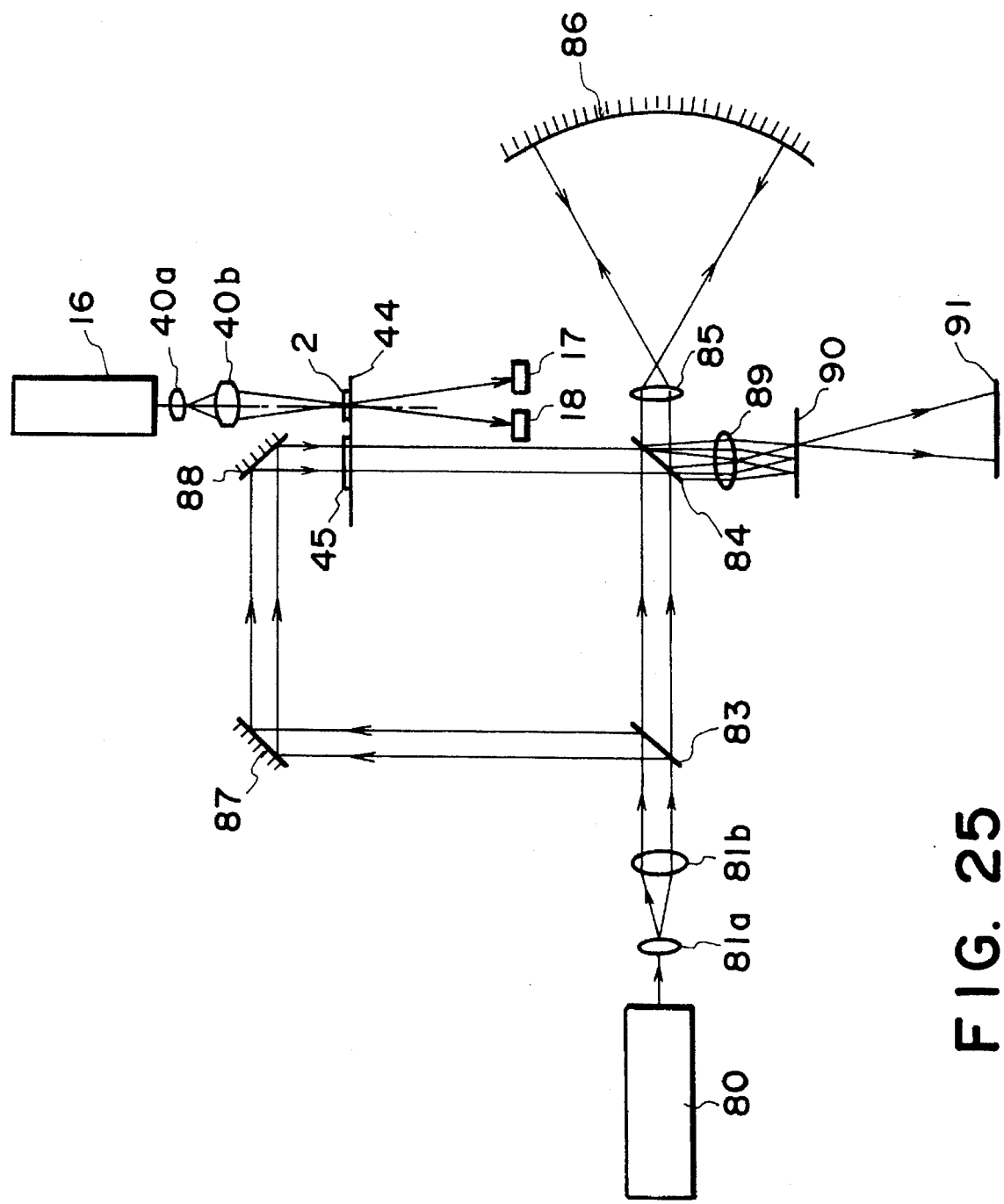
FIG. 25 is a schematic view of a main portion of a rotational deviation detecting system according to a fifth embodiment of the present invention.
Figure 26:
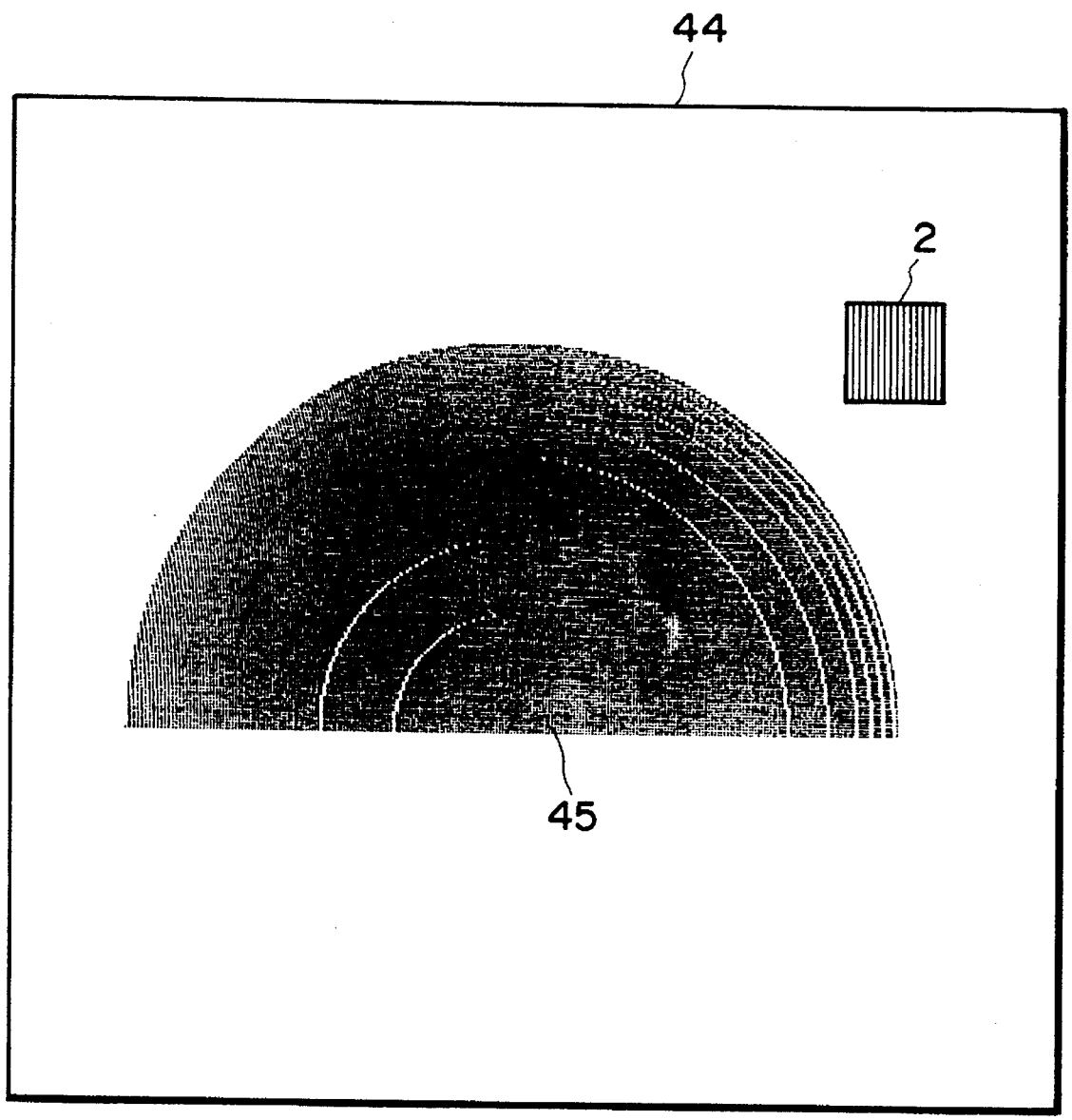
FIG. 26 is an enlarged view of a hologram used in the FIG. 21 example.

FIGS. 25 and 26 are schematic views, respectively, of a main portion of a fifth embodiment of the present invention. FIG. 25 illustrates an optical arrangement as a whole, and FIG. 26 illustrates a hologram in an enlarged view. Specifically, this embodiment is applied to a Tweiman-Green interferometer for aspherical surface inspection, using a computer hologram.

A light beam from a laser 80 is expanded by lenses 81a and 81b, and it is divided by a beam splitter 83. One of the divided beams passes the beam splitter and, thereafter, it goes through another beam splitter 84. Then, it is once collected by a lens 85 and, in the divergent form, it is directed to a surface 86 to be examined. It is reflected by this surface 86, and it goes again through the lens 85 and is reflected by the beam splitter 84. Then, it is collected by a lens 89.

The other beam divided by the beam splitter 83 is reflected thereby, and it goes via mirrors 87 and 88 so that it is projected on a hologram pattern portion 45 of a hologram 44. A reference wavefront as produced thereby goes through the beam splitter 84 and is collected by the lens 89. Then, any unwanted portion of it is removed by a spatial filter 90. Subsequently, it is directed onto an observation surface 91 together with the beam from the surface to be examined, whereby an interference fringe is produced.

This system may suitably be used for evaluation of an aspheric surface having a relatively large aspheric quantity.

In setting the hologram 44 for evaluation, rotation of the hologram is a problem. Thus, precise detection of rotational quantity is necessary.

In this embodiment, as shown in FIG. 22, a diffraction grating 2 for rotation detection is provided in the hologram 44 to assure precision of hologram setting.

The rotation detecting system is arranged so that, through the lenses 40a and 40b, the light beam from the light source 16 is projected onto the diffraction grating 2, and that positive and negative n-th order diffraction lights produced are detected by light position detecting sensors 17 and 18. The principle of detection of rotational quantity is the same as that of the first embodiment.

Figure 28:
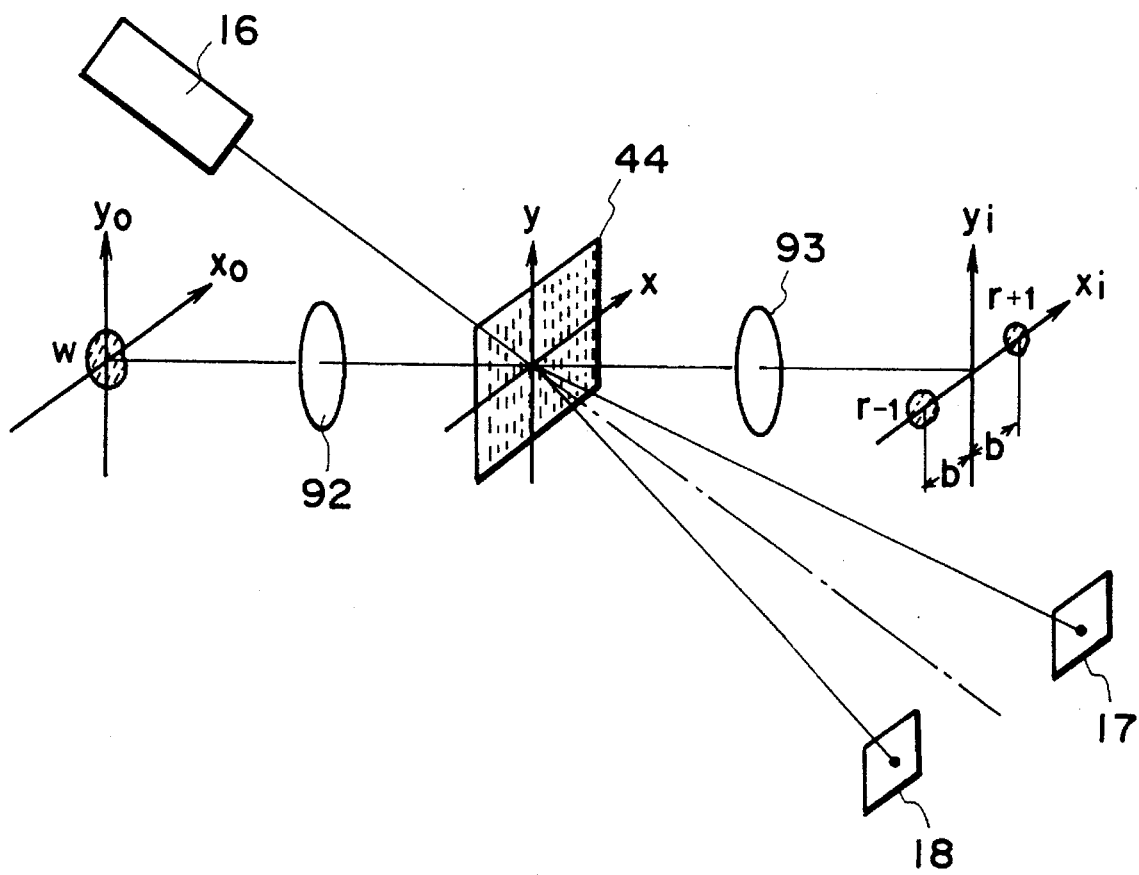
FIG. 28 is a schematic view of a main portion of a rotational deviation detecting system according to a sixth embodiment of the present invention.
Figure 30:
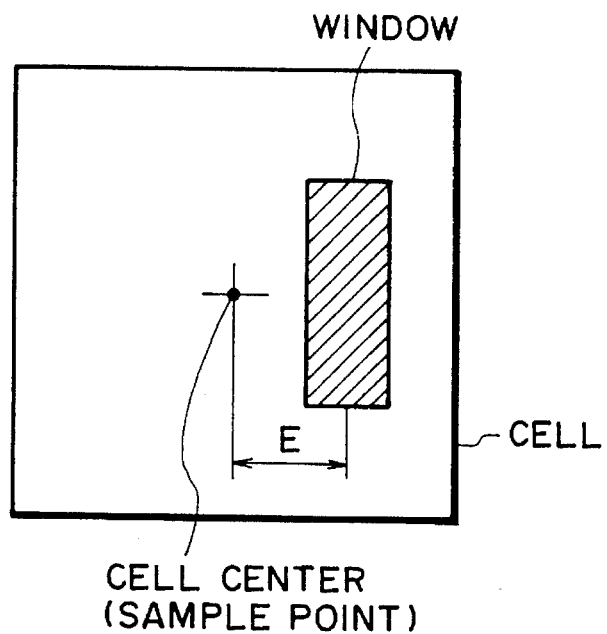
FIG. 30 is a schematic view of a cell used in the sixth embodiment of FIG. 28.

FIGS. 28 and 30 are schematic views, respectively, of a main portion of a sixth embodiment of the present invention. Specifically, this embodiment is applied to the filtering based on a Fourier transformation hologram, and it can be applied to the image processing or matched filtering.

In Fourier transformation holography, U, V and W are given by Fourier transformation of objects u, v and w. Also, an output image $r(x_i,y_i)$ of filtering corresponds to Fourier transformation of filter transmission light $T'(x,y)$. That is:

$$r(x_i, y_i) = F[T'(x,y)]$$
$$= F[k_0W + k_1W(|U|^2 + |V|^2)] + F[k_1WUV^*]$$

The second and third terms define positive and negative first order output images $r_{+1}$ and $r_{-1}$, and if ★ and * are assigned as the symbols of interrelation and convolution, then the following relations are present:

$$r_{+1}(x_i, y_i) = F[k_1WU^*V] = const \cdot \{(u^* \star w)^*v\}$$

$$r_{-1}(x_i, y_i) = F[k_1WUV^*] = const \cdot \{u^*(w \star v^*)\}$$

where $r_{+1}$ represents the convolution of v and the interrelation between $u^*$ and w, and $r_{-1}$ represents the convolution of u and the interrelation between $v^*$ and w.

Figure 27:
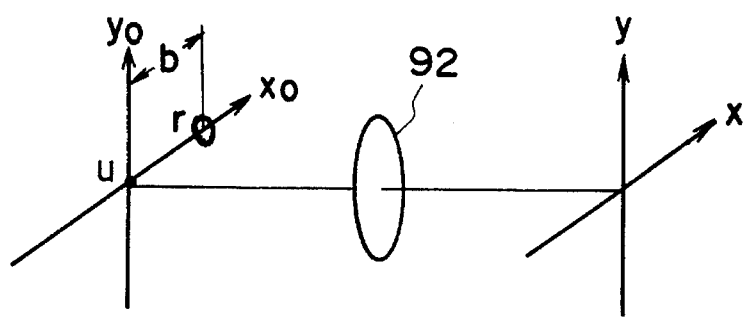
FIG. 27 is a schematic view for explaining a Fourier transformation hologram.

If, in a special case, as shown in FIG. 27, u is a reference point light source on the axis, and the object v is around the point spaced by b in the $x_0$ direction, then:

$$u(x_0,y_0) = \delta(x_0,y_0)$$

$$v'(x_0,y_0) = v(x_0-b,y_0)$$

$$u(x,y) = 1$$

$$V'(x,y) = V(x,y) \exp(-ibx)$$

The amplitude transmissivity of the hologram is:

$$T(x,y) = k_0 + k_1 + k_1|V|^2 + k_1V \exp(-ibx) + k_1 V^* \exp(ibx)$$

This is the Fourier transformation hologram of the object V. In the filtering, this hologram is used as a filter, and w is given on the axis as an input object. Then, the positive and negative output images of the hologram are the convolution of w and v and interrelation of w and $v^*$.

$$r_{+1}(x_i, y_i) = F[k_1WV]$$
$$= const \cdot \{w(x_i, y_i)^*v(x_i - b,y_i)\}$$
$$r_{-1}(x_i, y_i) = F[k_1WV^*]$$
$$= const \cdot \{w(x_i, y_i)^*v^*(x_i + b,y_i)\}$$

Thus, if w and v are the same, autocollimation and self-convolution of v are obtainable on the output image plane. Therefore, it can be applied to image processing or matched filtering.

On this occasion, the hologram 44 setting precision should be high. Particularly, it must be set without rotational error.

In this embodiment, as shown in FIG. 28, a rotation detecting system (16, 17, 18) is provided in a similar manner as in the first embodiment.

A light beam from a light source 16 is directly projected onto the hologram 44, and resultant diffraction lights are detected by light position sensors 17 and 18.

Figure 29:
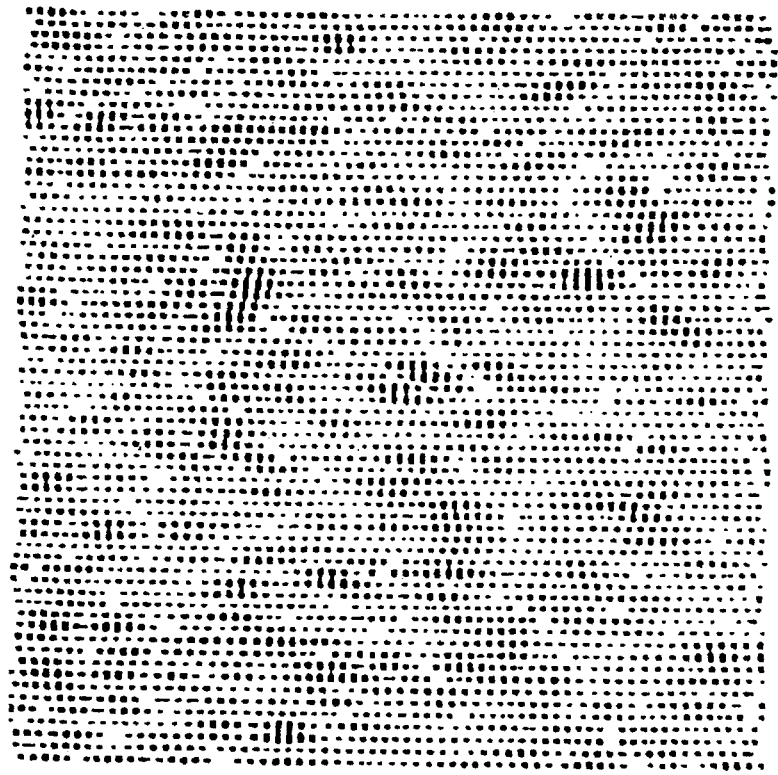
FIG. 29 is a schematic view of a hologram used in the sixth embodiment of FIG. 28.

As best seen in FIG. 29, the hologram 44 is defined by small rectangular openings arrayed periodically into a matrix structure. Each of divided regions of the matrix, i.e., each cell, is arranged so that the amplitude and phase of each cell correspond to the size of the window and the distance $\epsilon$ of the window from the cell center. In the example of FIG. 29, with respect to the longitudinal (up and down) direction, the cells are defined by rectangular openings of regular pitch. Thus, positive and negative diffraction lights may be produced with diffraction angles corresponding to this periodicity, and they may be detected, by which the rotational angle can be detected. The principle of detection itself is the same as that of the first embodiment.

It is possible to set the hologram 44 without rotation error, by correcting the hologram through a rotation control system (not shown) on the basis of the detected rotational deviation.

Figure 31:
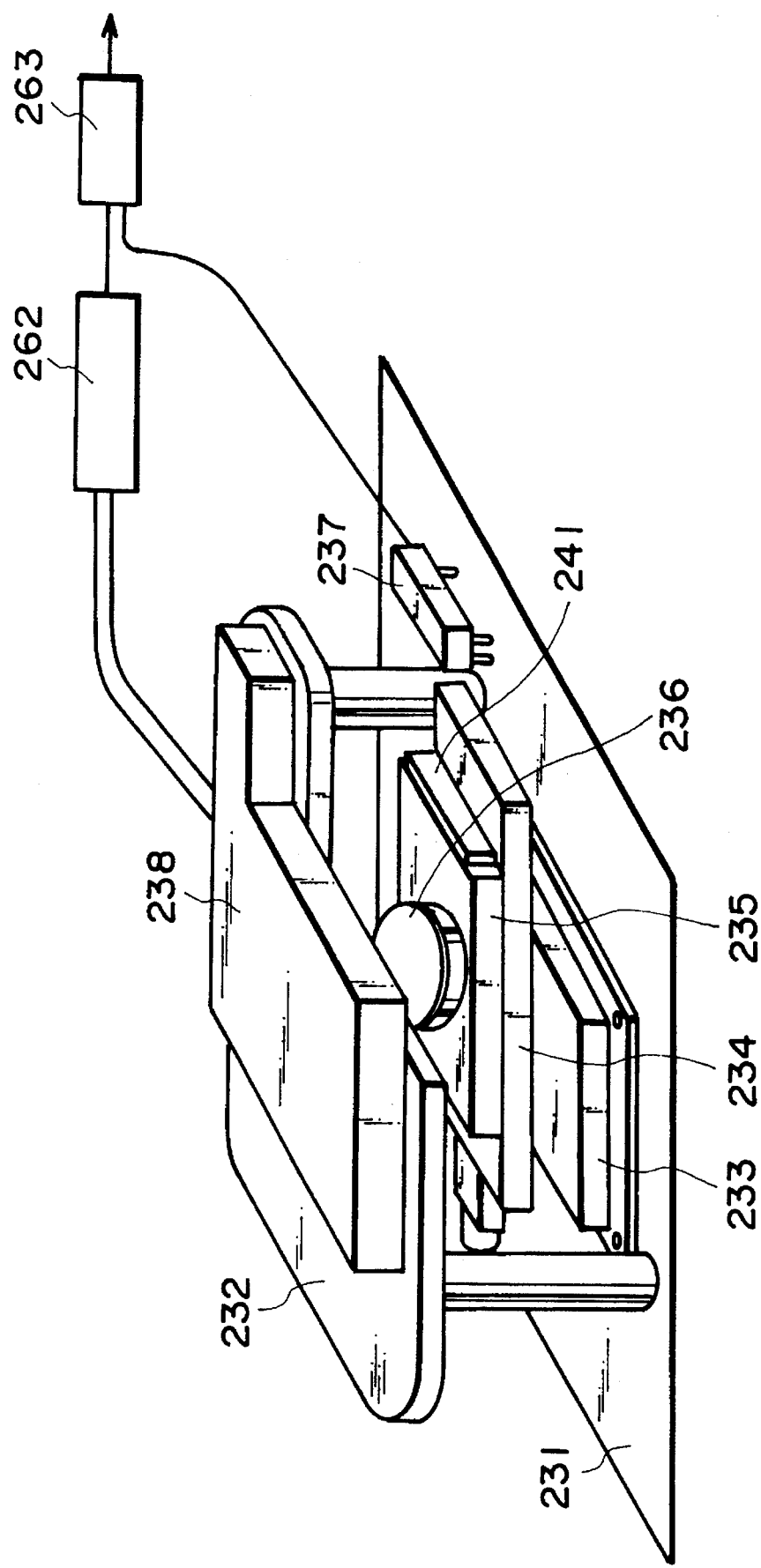
FIG. 31 is a schematic view of a main portion of a rotational deviation detecting system according to a seventh embodiment of the present invention.

FIG. 31 is a schematic view of a main portion of a rotational deviation detecting system according to a seventh embodiment of the present invention. Specifically, this embodiment is applied to high precision detection of a relative positional deviation between two diffraction gratings, as printed on a wafer through two exposure operations, for relative alignment of a mask and the wafer.

Figure 32:
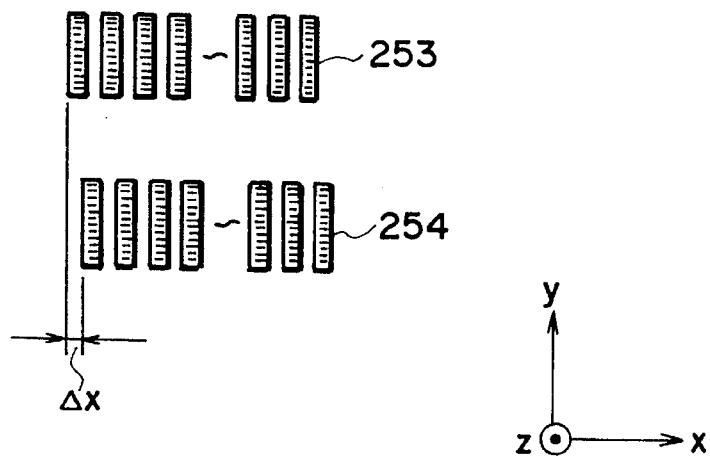
FIG. 32 is a fragmentary enlarged view of a portion of FIG. 31.

In FIG. 31, an X stage 233, a Y stage 234 and a θ stage 235 are mounted on a base 231. A wafer 236 is placed on the θ stage 235. Registration error measuring marks are formed on the wafer 236, wherein each mark comprises a set of two adjacent diffraction gratings 253 and 254 such as illustrated in FIG. 32. There is a second base 232 above the base 231, and an optical system 238 for measuring misregistration is mounted on the this base 232.

Figure 33:
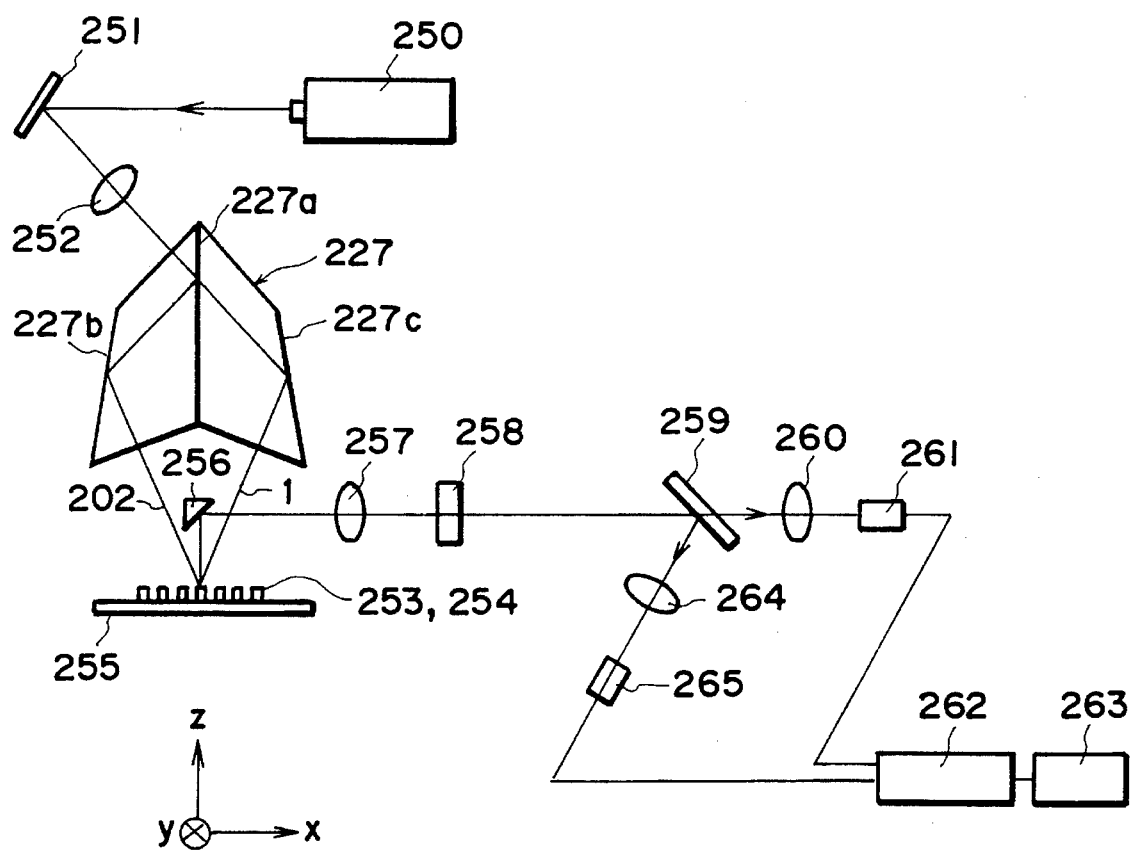
FIG. 33 is a schematic view for explaining a portion of FIG. 31.
Figure 34:
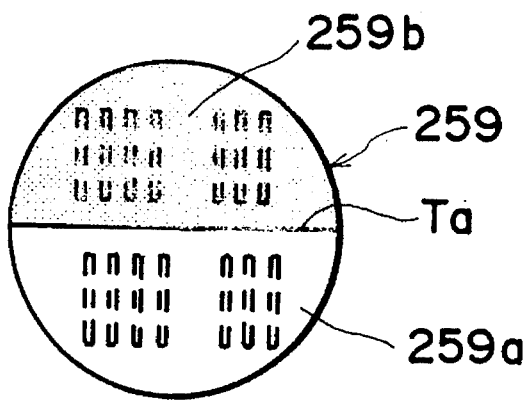
FIG. 34 is a schematic view for explaining a portion of FIG. 33.
Figure 36:
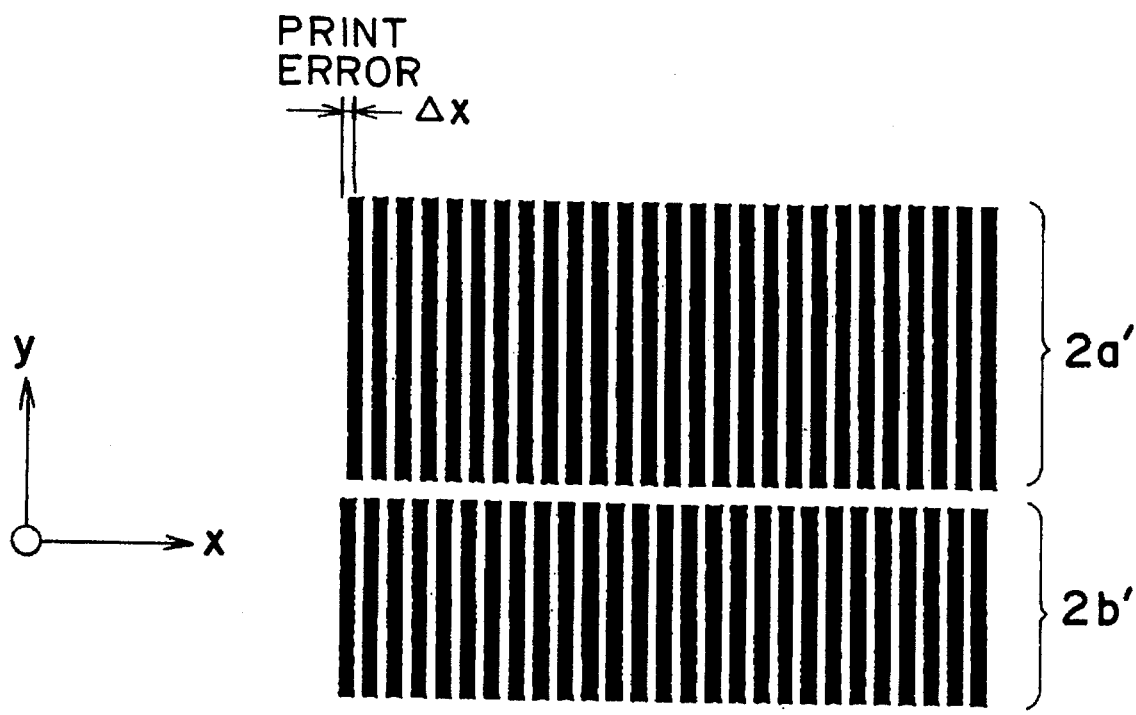
FIG. 36 is an enlarged view of a portion of FIG. 35.

FIG. 33 is a schematic view of positional deviation detecting means of the optical system 238 of FIG. 31. In the example of FIG. 33, the optical system 238 is provided by elements other than a phase difference meter 262 and a computing element 263.

In FIG. 33, there are a mirror 251, a collimator lens 252 and a prism 227 which are disposed along the direction of emission of light from a light source 250 which comprises a two-wavelength linear polarization laser. A wafer 255 having two diffraction gratings 253 and 254 such as shown in FIG. 28, is disposed in the direction of emission from the prism 227. On the other hand, a mirror 256, a lens 257, a Glan-Thompson prism 258, an edge mirror 259 (having a glass portion 259a and a mirror portion 259b such as shown in FIG. 30), a lens 260, and a photodetector 261 are disposed in the direction of reflection of light from the wafer 255. The output of the photodetector 261 is connected to the phase difference meter 262 and to the computing element 263. Further, a lens 264 and a photodetector 265 are disposed in the direction of reflection from the edge mirror 259, and the output of the photodetector 259 is connected to the phase difference meter 262.

S-polarized light of a frequency f1, emitted from the light source 50 (two-wavelength linear polarization laser), and P-polarized light of a frequency f2 from the same light source, are reflected by the mirror 251 and are projected onto the prism 227 by way of the collimator lens 252.

The S-polarized light of frequency f1 is reflected by a polarization beam splitter portion 227a of the prism 227, while S-polarized light of frequency f2 is transmitted by the prism, and then they are reflected by reflecting portions 227b and 227c, respectively. Then, they go out of the prism 227 and impinge on the diffraction gratings 253 and 254. In response, the lights are diffracted by the diffraction gratings 253 and 254, whereby diffraction lights are produced.

The diffraction gratings 253 and 254 of the wafer 255 comprise two adjoining straight diffraction gratings of regular spacing, having been formed on the wafer 255 through separate printing operations. They have the same pitch of p.

As shown in FIG. 32, the diffraction gratings 253 and 254 have a relative positional deviation $\Delta x$ in the X direction, produced by the printing. Here, the complex amplitude representation of positive first order diffraction light Ea(f1) of the left side incidence light of frequency f1 and that of negative first order diffraction light Ea(f2) of the right side incidence light of frequency f2, both caused by the diffraction grating 253, are given by equations (21) and (22) below:

$$Ea(f1)=A \exp\{i(w_1 t+\phi_1+\phi_a)\} \quad (21)$$

$$Ea(f2)=B \exp\{i(w_2 t+\phi_2-\phi_a)\} \quad (22)$$

where A and B are amplitudes, $w_1$ and $w_2$ are angular frequencies, and $\phi_1$ and $\phi_2$ are initial phases of lights as emitted by the light source 250, wherein $\phi a=2\pi xa/p$ and xa represents the amount of deviation of the diffraction grating 253 in the X direction from a reference phase.

Also, the complex amplitude representation of first order diffraction light Eb(f1) of the left side incidence light of frequency f1 and that of negative first order diffraction light Eb(f2) of frequency f2 of the right side incidence light, both caused by the diffraction grating 254, are given by equations (23) and (24) below:

$$Eb(f1)=A \exp\{i(w_1 t+\phi_1+\phi_b)\} \quad (23)$$

$$Eb(f2)=B \exp\{i(w_2 t+\phi_2-\phi_b)\} \quad (24)$$

where $\phi b=2\pi xb/p$ and xb represent the amount of deviation of the diffraction grating 254 in the X direction from the reference position.

The lights diffracted by the diffraction gratings 253 and 254 are reflected by the mirror 256, and they go through the lens 257 and the Glan-Thompson prism 258. By this prism 258, the polarization planes of the diffraction lights are registered, and they interfere with each other. Light intensity changes Ia and Ib of the respective heterodyne interference lights Ea(f1) and Ea(f2), and Eb(f1) and Eb(f2), namely, the beat signals, are given by equations (25) and (26) below:

$$Ia=A^2+B^2+2A\cdot B \cos\{(w_1-w_2)t+(\phi_1-\phi_2)+2\phi a\} \quad (25)$$

$$Ib=A^2+B^2+2A\cdot B \cos\{(w_1-w_2)t+(\phi_1-\phi_2)+2\phi b\} \quad (26)$$

Separation of the two diffraction lights may be done as follows: That is, since the two diffraction lights are spatially separated from each other minutely, the edge mirror 259 may be so set that the boundary line Ta between the glass portion 259a and the mirror portion 259b is placed at the middle of the diffraction lights from the two diffraction gratings 253 and 254. By doing so, the diffraction light from the diffraction grating 253 may be reflected by the edge mirror 259 and directed to the photodetector 265 through the lens 264; while, on the other hand, the diffraction light from the other diffraction grating 254 may be transmitted through the edge mirror 259 and directed to the photodetector 261 through the lens 260.

The beat signals as detected by the photodetectors 265 and 261 are applied to the phase difference meter 262 by which a phase difference between them is detected. If the phase difference is denoted by $\Delta\phi$, it is expressed by equation (27) below:

$$\Delta\phi=2(\phi a-\phi b)=4\pi(xa-xb)/p \quad (27)$$

Namely, the relative positional deviation $\Delta x$ between the diffraction gratings 253 and 254 in the X direction can be expressed by equation (28) below:

$$\Delta x=xa-xb=\Delta\phi\cdot p/4\pi \quad (28)$$

Thus, by applying the output $\Delta\phi$ of the phase difference meter 262 to the computing means 263 to make calculation in accordance with equation (28), the relative deviation between the diffraction gratings 253 and 254 can be determined.

By detecting deviation between a grating pattern printed by a first time printing and a grating pattern printed by a second time printing, it is possible to detect the alignment precision of a semiconductor exposure apparatus, that is, to detect the deviation between actual device patterns as printed through the first and second printing operations.

Figure 35:
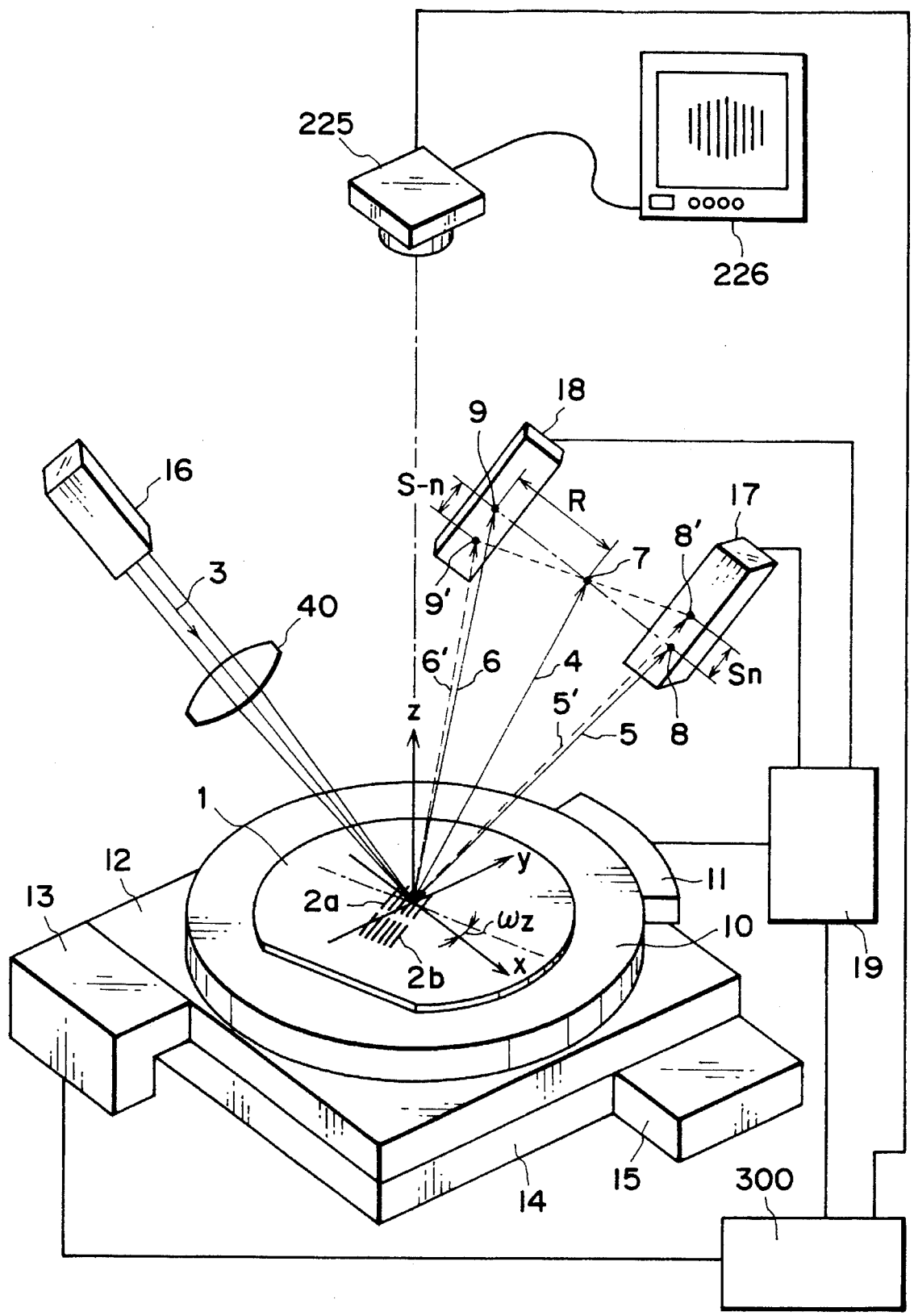
FIG. 35 is a schematic view for explaining a portion of FIG. 31.

FIG. 35 is a schematic view of a rotation correcting means of the optical system 238 of FIG. 31. This embodiment differs from the first embodiment of FIG. 6 in that the diffraction grating 2 of the wafer comprises (as a misregistration detecting pattern) a diffraction grating 2a as printed on the wafer through the n-th exposure process and a diffraction grating 2b as printed on the wafer through the (n+1)-th exposure process, and that the microscope system 20 is omitted while on the other hand an image processing alignment system 225 having an image pickup means, a TV monitor 226 and a system control means 300 are added. The remaining portion is of the same structure as that of the first embodiment.

The flow of operation in this embodiment from setting the wafer 1 on the sample table 10 to detection and correction of rotational deviation, as well as the structure of the measuring system are essentially the same as those of the first embodiment.

In this embodiment, as an important feature, an image processing method is used for evaluation of registration error. By means of the image processing alignment system 225, the diffraction grating patterns 2a and 2b for misregistration detection are imaged on the light receiving surface as images 2a' and 2b'. They are converted into image signals, and these signals are applied to the system control means 300.

The system control means 300 then performs the image processing to detect the center positions, with respect to the X direction, of the diffraction grating pattern images 2a' and 2b', respectively. Then, a difference $\Delta x$ between them is detected to thereby determine the registration error.

For detection of the center position of each of the diffraction grating pattern images 2a' and 2b', the position of each diffraction grating element is detected while excluding those grating elements which are at the opposite ends of each diffraction grating. Then, a deviation of each grating element from a corresponding reference is detected, and the thus detected deviations are averaged.

In the fifth embodiment of the present invention as described above, a light beam is projected on a diffraction grating pattern on a wafer, and beam positions of positive and negative n-th order diffraction lights (n is an integer), of the diffraction lights produced thereby, impinging on a predetermined plane, are detected. The amount of rotation along the surface is thereby detected, and control is done to correct the rotational deviation. After this, registration error is measured.

In this manner, any rotational deviation along the surface is removed and, thereafter, any misregistration is measured at high precision. Further, the misregistration measuring pattern itself is used without addition of a specific pattern for correction of rotation. Thus, the pattern region which is very narrow can be used efficiently.

While the invention has been described with reference to the structures disclosed herein, it is not confined to the details set forth and this application is intended to cover such modifications or changes as may come within the purposes of the improvements or the scope of the following claims.

What is claimed is:

1. A combination for detecting rotational deviation of an object, said combination comprising:
   a pattern provided on the object and having a periodicity;
   a laser for providing light;
   an optical system for projecting the light from said laser to said pattern;
   detecting means for detecting at least two diffraction lights, from said pattern, at a predetermined detection plane, wherein said optical system is disposed along a light path from said laser to said detecting means, and said optical system images a beam waist of said laser on a light path from said pattern to the predetermined detection plane; and
   determining means for determining rotational deviation of the object with respect to a predetermined axis, on the basis of incidence positions of the diffraction lights upon the predetermined detection plane, as detected by said detecting means.

2. A combination according to claim 1, wherein said pattern is provided by a diffraction grating.

3. A combination according to claim 1, wherein said pattern is provided by a circuit pattern.

4. A combination according to claim 1, wherein the two diffraction lights have diffraction orders of different signs.

5. A combination according to claims 4, wherein the two diffraction lights have diffraction orders of the same absolute value.

6. A combination according to claim 1, wherein said optical system projects the light from said laser to the pattern obliquely.

7. A combination according to claim 1, further comprising a rotationally movable holding base for holding the object, and control means for rotationally moving said holding base on the basis of the rotational deviation determined by said determining means.

8. A detection system for detecting positional deviation between first and second diffraction gratings provided on an object, said system comprising:
   a rotationally movable holding base for holding the object;
   a laser for providing light;
   an optical system for projecting the light from said laser to a pattern;
   first detecting means for detecting at least two diffraction lights, from the pattern, at a predetermined detection plane, wherein said optical system is disposed along a light path from said laser to said first detecting means, and said optical system images a beam waist of said laser on a light path from the pattern to said predetermined detection plane;
   determining means for determining rotational deviation of the object with respect to a predetermined axis, on the basis of incidence positions of the diffraction lights upon the predetermined detection plane, as detected by said first detecting means;
   second detecting means for detecting information related to the positional deviation between the first and second diffraction gratings; and
   control means for causing rotational motion of said holding base on the basis of the rotational deviation determined by said determining means and then causing said second detecting means to detect the information related to the positional deviation between the first and second diffraction gratings.

9. A system according to claim 8, wherein said second detecting means comprises:
   (i) illuminating means for projecting first and second light beams from a light source to the first and second diffraction gratings in different directions;
   (ii) first signal detecting means for detecting a first interference light signal produced as a combination of diffraction light provided by the first light and diffraction light provided by the second light, both from the first diffraction grating;
   (iii) second signal detecting means for detecting a second interference light signal produced as a combination of diffraction light provided by the first light and diffraction light provided by the second light, both from the second diffraction grating;
   (iv) phase difference detecting means for detecting a phase difference between the first and second interference light signals; and
   (v) deviation determining means for determining relative positional deviation between the first and second diffraction gratings on the basis of the phase difference detected by said phase difference detecting means.

10. A method of detecting rotational deviation of an object, said method comprising the steps of:
    providing, on the object, a pattern having a periodicity;
    projecting a coherent light beam through an optical system to the pattern;
    detecting at least two diffraction lights from the pattern, at a predetermined detection plane, wherein the optical system images a beam waist of the coherent light on a light path from the pattern to the predetermined detection plane; and
    determining rotational deviation of the object with respect to a predetermined axis, on the basis of incidence positions of the diffraction lights upon the predetermined detection plane, detected in said detecting step.

11. A method according to claim 10, wherein the pattern is provided by a diffraction grating.

12. A method according to claim 10, wherein the pattern is provided by a circuit pattern.

13. A method according to claim 10, wherein the two diffraction lights have diffraction orders of different signs.

14. A method according to claim 13, wherein the two diffraction lights have diffraction orders of the same absolute value.

15. A method according to claim 10, wherein the optical system projects light from a laser to the pattern obliquely.

16. A method of detecting positional deviation between first and second diffraction gratings formed on an object, said method comprising:
    a first detecting step for projecting a coherent light beam through an optical system to at least one of the first and second diffraction gratings and for detecting at least two diffraction lights from the one diffraction grating, at a predetermined detection plane, wherein the optical system images a beam waist of the coherent light on a light path from the one diffraction grating to the predetermined detection plane;
    a determining step for determining rotational deviation of the object with respect to a predetermined axis, on the basis of incidence positions of the diffraction lights upon the detection plane, as detected in said first detecting step;

a second detecting step for detecting information related to positional deviation between the first and second diffraction gratings; and a controlling step for causing rotational motion of the object on the basis of the rotational deviation determined in said determining step and then for performing said second detecting step to detect the information related to the positional deviation between the first and second diffraction gratings.

17. A method according to claim 16, wherein said second detecting step comprises:

(i) projecting first and second light beams from a light source to the first and second diffraction gratings in different directions;

(ii) detecting a first interference light signal produced as a combination of diffraction light provided by the first light and diffraction light provided by the second light, both from the first diffraction grating;

(iii) detecting a second interference light signal produced as a combination of diffraction light provided by the first light and diffraction light provided by the second light, both from the second diffraction grating;

(iv) detecting a phase difference between the first and second interference light signals; and (v) determining relative positional deviation between the first and second diffraction gratings on the basis of the phase difference, as detected in said phase difference detecting step.

18. A combination for detecting rotational deviation of an object on which a device is to be formed, said combination comprising:

a pattern provided on the object, the pattern being able to function as the device;

a light source for providing light;

detecting means for projecting the light from said light source to the pattern and for detecting at least two diffraction lights from the pattern, at a predetermined detection plane, wherein said detecting means images a beam waist of said light source on a light path from said pattern to the predetermined detection plane; and determining means for determining rotational deviation of the object with respect to a predetermined axis, on the basis of incidence positions of the diffraction lights upon the detection plane, as detected by said detecting means.

19. A combination according to claim 18, wherein the pattern is provided by a circuit pattern.

20. A combination according to claim 18, wherein the two diffraction lights have diffraction orders of different signs.

21. A combination according to claim 20, wherein the two diffraction lights have diffraction orders of the same absolute value.

22. A combination according to claim 18, wherein the light from the light source is projected to the pattern obliquely.

23. A method of detecting rotational deviation of an object on which a device is to be formed, said method comprising the steps of:

providing a pattern on the object, the pattern being able to function as the device;

projecting light through an optical system to the pattern and detecting at least two diffraction lights from the pattern, at a predetermined detection plane, wherein the optical system images a beam waist of the projected light on a light path from the pattern to the predetermined detection plane; and determining rotational deviation of the object with respect to a predetermined axis, on the basis of incidence positions of the diffraction lights upon the detection plane as detected in said detecting step.

24. A method according to claim 23, wherein the pattern is provided by a circuit pattern.

25. A method according to claim 23, wherein the two diffraction lights have diffraction orders of different signs.

26. A method according to claim 25, wherein the two diffraction lights have diffraction orders of the same absolute value.

27. A method according to claim 23, wherein the light is projected to the pattern obliquely.

* * * * *

UNITED STATES PATENT AND TRADEMARK OFFICE
CERTIFICATE OF CORRECTION

PATENT NO. : 5,550,635      Page 1 of 3
DATED : August 27, 1996
INVENTOR(S) : KENJI SAITOH, ET AL.

It is certified that error appears in the above-indentified patent and that said Letters Patent is hereby corrected as shown below:

ON THE COVER PAGE:

Under "Inventors", item [75]

Line 2, "Kanagawa-ken;" should read --Kanagawa;--.

Under "FOREIGN PATENT DOCUMENTS," in item [56]

```
"03272406  12/1991  Japan
 04212002   8/1992  Japan" should read
--3-27246  12/1991  Japan
 4-212002   8/1992  Japan--.
```

IN THE DISCLOSURE:

COLUMN 1:

Line 33, "detected" should read --detected,--.

UNITED STATES PATENT AND TRADEMARK OFFICE
CERTIFICATE OF CORRECTION

PATENT NO. : 5,550,635
DATED : August 27, 1996
INVENTOR(S) : KENJI SAITOH, ET AL.

It is certified that error appears in the above-indentified patent and that said Letters Patent is hereby corrected as shown below:

COLUMN 4:

Line 48, "$\{(w_1-w_2)t+(\phi_1-100_2)+$" should read --$\{(w_1-w_2)t+(\phi_1-\phi_2)+$--.

COLUMN 11:

Line 49, "$w_z=(S_n S_{-n})/(2R)$" should read --$w_z=(S_n-S_{-n})/(2R)$--.

COLUMN 12:

Line 26, "$W=W_0[1+(\lambda u/\pi W_0^2)^2]^{+\alpha/n\,1/2}+ee$" should read --$W=W_0[1+(\lambda u/\pi W_0^2)^2]^{1/2}$--;

Line 38, "$W_{11}=W_{21}[1+(\lambda l_1/\pi W_{21}^2)^2]^{+\alpha/n\,1/2}+ee$" should read --$W_{11}=W_{21}[1+(\lambda l_1/\pi W_{21}^2)^2]^{1/2}$--;

Line 55, "$W_{22}=W_{12}[1+(\lambda l_2/\pi W_{12}^2)^2]^{+\alpha/n\,1/2}+ee$" should read --$W_{22}=W_{12}[1+(\lambda l_2/\pi W_{12}^2)^2]^{1/2}$--.

UNITED STATES PATENT AND TRADEMARK OFFICE
CERTIFICATE OF CORRECTION

PATENT NO. : 5,550,635
DATED : August 27, 1996
INVENTOR(S) : KENJI SAITOH, ET AL.

It is certified that error appears in the above-indentified patent and that said Letters Patent is hereby corrected as shown below:

COLUMN 17:

Line 45, "= const · [w($x_i, y_i$)˙v˙($x_i$+b,$y_i$)}" should read -- = const · [w($x_i, y_i$)*v˙($x_i$+b,$y_i$)} --.

COLUMN 21:

Line 28, "claims 4," should read --claim 4,--.

Signed and Sealed this

Eighteenth Day of February, 1997

BRUCE LEHMAN

Attest:

Attesting Officer

Commissioner of Patents and Trademarks